(12) United States Patent
Li et al.

(10) Patent No.: US 12,191,159 B2
(45) Date of Patent: Jan. 7, 2025

(54) METHOD FOR ENHANCING STABILITY OF N-TYPE SEMICONDUCTOR THROUGH OXYGEN ELIMINATION

(71) Applicant: Tianjin University, Tianjin (CN)

(72) Inventors: Liqiang Li, Tianjin (CN); Liqian Yuan, Tianjin (CN); Yinan Huang, Tianjin (CN); Jinbo He, Tianjin (CN); Wenping Hu, Tianjin (CN)

(73) Assignee: Tianjin University, Tianjin (CN)

( * ) Notice: Subject to any disclaimer, the term of this patent is extended or adjusted under 35 U.S.C. 154(b) by 0 days.

(21) Appl. No.: 18/640,125

(22) Filed: Apr. 19, 2024

(65) Prior Publication Data
US 2024/0266187 A1    Aug. 8, 2024

Related U.S. Application Data

(63) Continuation of application No. PCT/CN2022/141769, filed on Dec. 26, 2022.

(30) Foreign Application Priority Data

Jan. 7, 2022   (CN) .......................... 202210013229.3
May 31, 2022   (CN) .......................... 202210604523.1

(51) Int. Cl.
*H01L 21/322* (2006.01)
(52) U.S. Cl.
CPC ................................ *H01L 21/3221* (2013.01)
(58) Field of Classification Search
None
See application file for complete search history.

(56) References Cited

U.S. PATENT DOCUMENTS

2006/0180199 A1* 8/2006 Lenhard ............... H10K 85/621
                                                        136/263
2008/0308807 A1   12/2008 Yamazaki et al.
(Continued)

FOREIGN PATENT DOCUMENTS

CN         102443137 A     5/2012
CN         111490161 A     8/2020
(Continued)

OTHER PUBLICATIONS

Machine Language Translation of CN-111490161-A (Year: 2020).*
(Continued)

*Primary Examiner* — Erik Kielin
(74) *Attorney, Agent, or Firm* — Pilloff Passino & Cosenza LLP; Rachel Pilloff; Sean Passino

(57) ABSTRACT

A method for enhancing the stability of an N-type semiconductor through oxygen elimination includes constructing an antioxidant layer on the surface of a semiconductor material, or blending the antioxidant with the N-type semiconductor material. The antioxidant removes the existing oxygen and related species in the N-type semiconductor, eliminates the related trap state, and prevents the N-type semiconductor from further degrading, so that the electrical properties such as mobility of the N-type semiconductor device are improved, and the operation stability and long-term storage stability are improved. In addition, the antioxidant also inhibits the photobleaching of N-type semiconductors and significantly improves the photochemical stability of N-type semiconductors.

7 Claims, 64 Drawing Sheets

(56) References Cited

U.S. PATENT DOCUMENTS

| | | | | |
|---|---|---|---|---|
| 2012/0125431 A1* | 5/2012 | Oizumi | ............... | H10K 50/846 |
| | | | | 257/E31.119 |
| 2012/0175602 A1* | 7/2012 | Hwang | ............... | H10K 85/623 |
| | | | | 257/E51.025 |
| 2014/0190566 A1 | 7/2014 | Itoh | | |
| 2020/0287070 A1 | 9/2020 | Inokuchi et al. | | |
| 2020/0295292 A1* | 9/2020 | Kim | ...................... | H10K 50/19 |
| 2022/0255007 A1* | 8/2022 | Inokuchi | ............. | H10K 85/151 |

FOREIGN PATENT DOCUMENTS

| | | |
|---|---|---|
| CN | 114937742 A | 8/2022 |
| JP | 2004088094 A | 3/2004 |
| JP | 2005005582 A | 1/2005 |

OTHER PUBLICATIONS

Sharma, et al. "Shellac—Structure, Characteristics, & Modification", Defense Science Journal, vol. 33(3), Feb. 1983, pp. 261-271 (Year: 1983).*
Properties of astaxanthin from the on-line resource, Chemistry Book available at URL, https://www.chemicalbook.com/ChemicalProductProperty_EN_CB3459595.htm (Year: 2024).*
Material Data Safety Sheet for Pseudocumene (Year: 2024).*
Material Data Safety Sheet for Propiophenone (Year: 2024).*
Notification to Grant Patent for China Application No. 202210604523.1, mailed Jan. 5, 2023.
First Office Action for China Application No. 202210604523.1, mailed Oct. 18, 2022.
International Search Report for PCT/CN2022/141769, mailed Feb. 28, 2023.

* cited by examiner

METHOD FOR ENHANCING STABILITY OF N-TYPE SEMICONDUCTOR THROUGH OXYGEN ELIMINATION

CROSS-REFERENCE TO RELATED APPLICATIONS

This application is a continuation of PCT/CN2022/141769, filed on Dec. 26, 2022 and claims priorities of Chinese Patent Application No. 202210013229.3, filed on Jan. 7, 2022, and No. 202210604523.1, filed on May 31, 2022, the entire contents of which are incorporated herein by reference.

TECHNICAL FIELD

The application relates to a method for enhancing stability of a Negative (N)-type semiconductor, and in particular to a method for enhancing stability of an N-type semiconductor through oxygen elimination, and belongs to the technical field of semiconductor materials.

BACKGROUND

Semiconductor materials have been widely studied because of their diverse structures, flexibility and large processable areas, and are applicable in flexible display, integrated circuits, electronic skin and other fields. Compared with Positive (P)-type semiconductor, stability is a challenging problem for N-type semiconductor, and seriously hinders the development of complementary circuits and heterojunction integration. As is known, water and oxygen in the air are the key factors causing the instability of N-type semiconductor devices. Although low lowest unoccupied molecular orbital (LUMO) energy level and high electron affinity enable the synthesized N-type semiconductor materials to resist oxidation to some extent, the organic free radical anions generated in the operation process are still thermodynamically unstable and easily react with water, oxygen and related species, thus causing strong electron capture and even device degradation.

At present, the reported methods to enhance the stability of N-type semiconductors are mainly through molecular design or packaging strategy, but these schemes have some problems. For example, when air-stabilized N-type semiconductors are being designed, it is common to introduce specific electron-withdrawing groups to reduce LUMO energy level. Considering the reduction potential of water and oxygen, in theory, LUMO must reach at least −4.0 eV to prevent the electron transfer of organic free radical anions, which is obviously a huge challenge and seriously limits the practical application range of N-type semiconductors. Another common strategy is packaging. However, even without considering the increase of manufacturing process and related costs, the packaging of devices is not conducive to the application of N-type semiconductors in transparent displays, photodetectors and chemical sensors. In addition, a perfect packaging layer that is capable of completely and effectively blocking the invasion of water and oxygen is unavailable. Therefore, it is still an urgent need for a brand-new scheme to effectively improve the operation and environmental stability of N-type semiconductor materials.

SUMMARY

Aiming at the shortcomings of the prior art, the application aims to provide a method for enhancing stability of an N-type semiconductor through oxygen elimination.

The method for enhancing stability of the N-type semiconductor through oxygen elimination of the application is to construct an antioxidant layer on a surface of a semiconductor material, or to blend an antioxidant with the N-type semiconductor material, so as to remove the oxygen added into the N-type semiconductor, eliminate the related trap state in the forbidden band, prevent the N-type semiconductor from further degrading, improve the chemical stability of the N-type semiconductor, and therefore realize the long-term service of the N-type semiconductor thin film device under environmental conditions.

The method for constructing the antioxidant layer on the surface of a semiconductor device includes uniformly coating an antioxidant solution on the surface of the N-type semiconductor by spin-coating, dip-coating or drop-casting, and then naturally curing or vacuum annealing curing. The thickness of an obtained antioxidant layer thin film is controlled between 1 nanometer (nm) and 2 centimeters (cm).

The method for blending the antioxidant layer with the N-type semiconductor molecule includes blending the antioxidant solution with the semiconductor material, and uniformly coating by vacuum evaporation, spin-coating, dip-coating or drop-casting. The concentration of antioxidant is controlled in the range of $1\times10^{-5}$ mole per milliliter (mol/mL)-100 mol/mL, and the mass ratio of antioxidant to semiconductor material is controlled in the range of 1:1-1:$10^5$.

The antioxidant is a free radical absorber, a metal ion chelating agent, a peroxide decomposer, an enzyme antioxidant, an ultraviolet absorber and the like. The free radical absorber is ascorbic acid (VC), tocopherol (VE), anthocyanin, tea polyphenols, astaxanthin, baicalin, quercetin, rutin, liquiritin, silymarin, puerarin, rotenone, isoliquiritigenin, isobavachalcone, catechin, ginkgetin, butyl hydroxyanisole, dibutylhydroxytoluene, tert-butyl hydroquinone, propyl gallate, etc. The metal ion chelating agent is ethylene diamine tetraacetic acid, aminotriacetic acid, dihydroxyethyl glycine, ethylenediaminetetraacetic acid disodium salt, citric acid, tartaric acid, gluconic acid, sodium gluconate, ammonium citrate, hydroxyethyl ethylenediamine triacetic acid, polyacrylic acid, polymethacrylic acid, hydrolyzed polymaleic anhydride, etc. The peroxide decomposer is subphosphite ester, dithiophosphoric acid-O,O-dimethyl ester, etc. The enzyme antioxidant is superoxide dismutase, thioredoxin peroxidase, glutathione peroxidase, catalase, etc. The ultraviolet absorber is phenyl salicylate, 2-(2-hydroxy-5-methylphenyl)benzotriazole, 2,4-dihydroxy benzophenone, 4,2-hydroxy-4-n-octyloxybenzophenone, and 2-(2'-hydroxy-3', 5'-di-tert-phenyl)-5-benzotriazole chloride, resorcinol monobenzoate, 2,2'thiobis(4-tert-octylphenoxy) nickel, tris (1,2,2,6,6-pentamethylpiperidyl)phosphite, 4-benzoyloxy-2, 2,6,6-tetramethylpiperidine, 2,4,6-tris(2'n-butoxyphenyl)-1, 3,5-triazine, hexamethylphosphoryl triamine, etc. Different types of antioxidants have different degrees of improving the property and stability of N-type semiconductor materials and devices.

In order to obtain more uniform antioxidant thin films, organic polymers may also be added to the antioxidant solution. The addition of polymer solution may inhibit the crystallization of antioxidant, help to obtain more uniform and stable amorphous antioxidant thin films, and be beneficial to the long-term stability of antioxidant thin films and N-type semiconductors. The organic polymer is an organic high-molecular polymer such as polyurethane, polystyrene and polyimide, and the mass ratio of the organic polymer to the antioxidant is controlled in a range of 1:10-1:1000.

The concentration of antioxidant and organic polymer in antioxidant solution will not affect the stability of N-type semiconductor device as long as it does not change the structure of semiconductor film. Generally, the concentration of antioxidant is controlled in the range of $1\times10^{-5}$ mol/mL-100 mol/mL.

The N-type semiconductor device is field effect transistors, a solar cell, a light emitting diode, an inverter and other devices prepared by using the N-type semiconductor thin film or crystal.

The N-type semiconductor material may be an organic small-molecule semiconductor such as C60, N,N'-dioctyl-3,4,9,10-perylene dicarboximide (PTCDI-C8), perylene-3,4,9,10-tetracarboxylic acid dianhydride (PTCDA), PTCP-$CH_2C_3F_7$, DCyNTDA, $F_{16}CuPc$ or HAT-CN. N-type semiconductor materials may be organic polymers such as N2200 or benzodifurandione-based polyphenylene vinylene (BDPPV) The N-type semiconductor may also be a two-dimensional inorganic semiconductor such as black phosphorus (BP), $WS_2$ (tungsten disulfide) or $MoS_2$ (molybdenum disulfide).

The principle of the application is that the antioxidant layer is constructed on the surface of the N-type semiconductor device or blend thin film of an antioxidant and N-type semiconductor molecules is constructed, so that the antioxidant not only removes oxygen and related species added into the N-type semiconductor, and eliminates the related trap state in the forbidden band, but also prevents the N-type semiconductor from further degrading, so that the electrical properties such as the mobility of the N-type semiconductor device are improved, and the operation stability and long-term storage stability are improved. In addition, the antioxidant may also inhibit the photobleaching process of N-type semiconductor thin films, significantly improve the photochemical stability of N-type semiconductor thin films, and then realize the long-term life of N-type semiconductor thin film devices under environmental conditions. By comparing the property tests of the N-type semiconductor devices which are not covered and are not mixed with antioxidant, it is found that the electrical properties such as mobility and the like of the N-type semiconductor devices prepared by the method of the application are improved, and the operation stability and long-term storage stability are improved.

DETAILED DESCRIPTION OF THE EMBODIMENTS

Figure 1A:
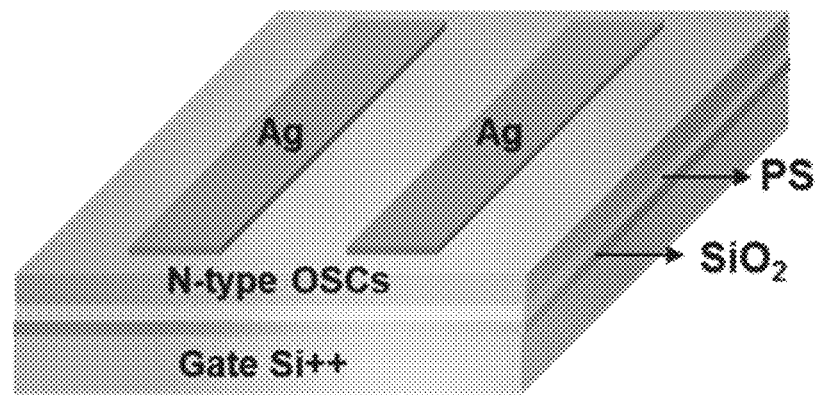
FIG. 1A is a schematic structural diagram of a pristine PTCDI-$C_8$ thin film organic field effect transistor prepared in Comparative embodiment 1.

The method, principle and effect of enhancing the stability of N-type semiconductor of the present application are further explained by specific embodiments.

The purchasing sources of chemicals in embodiments and comparative embodiments are as follows.

N-type organic semiconductor (OSC): PTCDI-$C_8$(N,N'-dioctyl-3,4,9,10-perylene dicarboximide): purity: 99%, source: Shanghai Daran Chemical Co., Ltd.; N2200(P (NDI2OD-T2) polymer organic semiconductor): average molecular weight: 30,000-300,000, source: Sigma Aldrich (Shanghai) Trading Co., Ltd.; C60 (fullerene): purity: 99%, source: Shanghai Daran Chemical Co., Ltd.; PTCDA (perylene tetracarboxylic dianhydride): purity: 99%, source: Sigma Aldrich (Shanghai) Trading Co., Ltd.; HAT-CN: purity: 99%, source: Shanghai Daran Chemical Co., Ltd. BDPPV (benzodifurandione-based polyphenylene vinylene: polymer organic semiconductor): purity: 99%, Ningbo Boya Juli New Materials Technology Co., Ltd.; $F_{16}CuPc$ (copper perfluorophthalocyanine): purity: 99%, source: Sigma Aldrich (Shanghai) Trading Co., Ltd.; PTCP-$CH_2C_3F_7$: purity: 99%, source: Shanghai Daran Chemical Co., Ltd.; DCyNTDA: purity: 99%, source: Shanghai Daran Chemical Co., Ltd. Two-dimensional inorganic semiconductor: $MoS_2$: crystal structure: hexagonal system, transverse dimension: 1-1.5 cm, purity: >99.995%, source: Shanghai PrMat Technology Co., Ltd. Organic high-molecular polymer: PS (polystyrene): purity: 99%, source: Bailingwei Technology Co., Ltd.; PU (polyurethane), average molecular weight: 1000-2,000, source: Anhui Zhongen Chemical Co., Ltd.; PI (polyimide): purity: thermoplastic, average molecular weight: 50,000-80,000, source: Tianjin Tongda Liyang Technology Co., Ltd. Antioxidant: VC (ascorbic acid): source: Meryer (Shanghai) Chemical Technology Co., Ltd.; 3,3'-dihydroxy-4,4'-diketone-β (astaxanthin): purity: 98%, source: Tianjin Hongfeng Weili Technology Development Co., Ltd.; ethylene diamine tetraacetic acid (EDTA): purity: c(EDTA)=0.1 mol/L(0.1N), source: Shanghai Titan Technology Co., Ltd.; amino triacetic acid (NTA): purity: 99%, source: Beijing InnoChem Science and Technology Co., Ltd.; subphosphite ester: purity: 99%, source: Changzhou Jianmao Chemical Co., Ltd.; dithiophosphoric acid-O,O-dimethyl ester: purity: 96%, source: Tianjin Shengbaihao Biotechnology Co., Ltd.; superoxide dismutase (SOD), purity: biochemical purity, source: Beijing Haosai Technology Co., Ltd.; thioredoxin peroxidase (TPX), purity: biochemical purity, source: Nuoshinuoke Laboratory Equipment Distribution Center, Nankai District, Tianjin; 2-(2-hydroxy-5-methylphenyl)benzotriazole: purity: 99%, source: Hubei Meifeng Chemical Co., Ltd.; 2,4-dihydroxy benzophenone: purity: 99%, source: Merck. Other organic molecules: ODTS (octadecyltrichlorosilane): purity: 99%, source: Sigma Aldrich (Shanghai) Trading Co., Ltd.

In the following embodiments and comparative embodiments, Comparative Embodiments 1-10 are used for comparison with the high-stability field effect transistor of the present application, and Embodiments 1-23 are the high-stability field effect transistors of the present application.

Embodiment 1

(1) taking a 500 micron (μm)-thick heavily doped silicon wafer as a grid electrode and silicon dioxide naturally oxidized on the surface of the heavily doped silicon wafer as a dielectric layer with a thickness of 300 nanometers (nm);

(2) spin-coating 5 milligram per milliliter (mg/mL) polystyrene chloroform solution on the surface of the dielectric layer at a rotating speed of 2,000 revolutions per minute (rpm) for 30 seconds (s), and annealing at 60° C. for 30 minutes (min) to obtain a PS thin film with a thickness of 25 nm;

(3) depositing the organic semiconductor PTCDI-$C_8$ thin film on the surface of PS thin film by evaporation at a rate of 0.05 Angstrom/second (Å/s) to a thickness of 20 nm;

(4) depositing a silver source and a drain electrode with a thickness of 20 nm on the organic semiconductor layer by evaporation at a rate of 0.1 Å/s to obtain the PTCDI-$C_8$ thin film organic field effect transistor; and (5) dissolving ascorbic acid powder in ethanol solution to make the concentration of ascorbic acid 0.03 mole/milliliter (mol/mL); spin-coating ascorbic acid solution on the surface of the pristine PTCDI-$C_8$ thin film organic field effect transistor, and annealing at 60° C. for 1 hour (h), and solidifying into a film, thus obtaining an ascorbic acid thin film with a thickness of 100 nm.

Embodiment 2

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing blend thin film of the organic semiconductor PTCDI-$C_8$ and ascorbic acid (the mass ratio of organic semiconductor PTCDI-$C_8$ to ascorbic acid is 1000:1) on the surface of PS thin film by evaporation at a rate of 0.05 Å/s to a thickness of 20 nm; and (4) depositing a silver source and a drain electrode with a thickness of 20 nm on the organic semiconductor layer by evaporation at a rate of 0.1 Å/s to obtain the PTCDI-$C_8$ thin film organic field effect transistor.

Embodiment 3

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor PTCDI-$C_8$ thin film on the surface of PS thin film by evaporation at a rate of 0.05 Å/s to a thickness of 20 nm;

(4) depositing a silver source and a drain electrode with a thickness of 20 nm on the organic semiconductor layer by evaporation at a rate of 0.1 Å/s to obtain the PTCDI-$C_8$ thin film organic field effect transistor; and (5) dissolving astaxanthin powder in ethanol solution to make the concentration of astaxanthin 0.03 mol/mL; spin-coating astaxanthin solution on the surface of the pristine PTCDI-$C_8$ thin film organic field effect transistor, and annealing at 60° C. for 1 h, and solidifying into a film, thus obtaining an antioxidant thin film with a thickness of 100 nm.

The difference between this embodiment and Embodiment 1 is that the astaxanthin thin film is used instead of the ascorbic acid thin film, and all other conditions are the same.

Embodiment 4

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor PTCDI-$C_8$ thin film on the surface of PS thin film by evaporation at a rate of 0.05 Å/s to a thickness of 20 nm;

(4) depositing a silver source and a drain electrode with a thickness of 20 nm on the organic semiconductor layer by evaporation at a rate of 0.1 Å/s to obtain the PTCDI-$C_8$ thin film organic field effect transistor; and (5) dissolving ethylene diamine tetraacetic acid powder in ethanol solution to make the concentration of ethylene diamine tetraacetic acid 0.03 mol/mL; spin-coating ethylene diamine tetraacetic acid solution on the surface of the pristine PTCDI-$C_8$ thin film organic field effect transistor, and annealing at 60° C. for 1 h, and solidifying into a film, thus obtaining an ethylene diamine tetraacetic acid thin film with a thickness of 100 nm.

The difference between this embodiment and Embodiment 1 is that the ascorbic acid thin film is replaced by ethylene diamine tetraacetic acid thin film, and all other conditions are the same.

Embodiment 5

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor PTCDI-$C_8$ thin film on the surface of PS thin film by evaporation at a rate of 0.05 Å/s to a thickness of 20 nm;

(4) depositing a silver source and a drain electrode with a thickness of 20 nm on the organic semiconductor layer by evaporation at a rate of 0.1 Å/s to obtain the PTCDI-$C_8$ thin film organic field effect transistor; and (5) dissolving aminotriacetic acid powder in ethanol solution to make the concentration of aminotriacetic acid 0.03 mol/mL; spin-coating ethylene diamine tetraacetic acid solution on the surface of the pristine PTCDI-$C_8$ thin film organic field effect transistor, and annealing at 60° C. for 1 h, and solidifying into a film, thus obtaining an aminotriacetic acid thin film with a thickness of 100 nm.

The difference between this embodiment and Embodiment 1 is that aminotriacetic acid thin film is used instead of ascorbic acid thin film, and all other conditions are the same.

Embodiment 6

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor PTCDI-$C_8$ thin film on the surface of PS thin film by evaporation at a rate of 0.05 Å/s to a thickness of 20 nm;

(4) depositing a silver source and a drain electrode with a thickness of 20 nm on the organic semiconductor layer by evaporation at a rate of 0.1 Å/s to obtain the PTCDI-$C_8$ thin film organic field effect transistor; and (5) dissolving subphosphite ester in ethanol solution to make the concentration of subphosphite ester 0.03 mol/mL; spin-coating subphosphite ester solution on the surface of the pristine PTCDI-$C_8$ thin film organic field effect transistor, and annealing at 60° C. for 1 h, and solidifying into a film, thus obtaining a subphosphite ester thin film with a thickness of 100 nm.

The difference between this embodiment and Embodiment 1 is that subphosphite ester thin film is used instead of ascorbic acid thin film, and all other conditions are the same.

Embodiment 7

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving dithiophosphoric acid-O,O-dimethyl ester in ethanol solution to make the concentration of dithiophosphoric acid-O,O-dimethyl ester 0.03 mol/mL; spin-coating dithiophosphoric acid-O,O-dimethyl ester solution on the surface of the pristine PTCDI-$C_8$ thin film organic field effect transistor, and annealing at 60° C. for 1 h, and solidifying into a film, thus obtaining a dithiophosphoric acid-O,O-dimethyl ester thin film with a thickness of 100 nm.

The difference between this embodiment and Embodiment 1 is that dithiophosphoric acid-O,O-dimethyl ester thin film is used instead of ascorbic acid thin film, and all other conditions are the same.

Embodiment 8

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving superoxide dismutase in ethanol solution to make the concentration of superoxide dismutase 0.03 mol/mL; spin-coating superoxide dismutase solution on the surface of the pristine PTCDI-$C_8$ thin film organic field effect transistor, and annealing at 60° C. for 1 h, and solidifying into a film, thus obtaining a superoxide dismutase thin film with a thickness of 100 nm.

The difference between this embodiment and Embodiment 1 is that superoxide dismutase thin film is used instead of ascorbic acid thin film, and all other conditions are the same.

Embodiment 9

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving thioredoxin peroxidase in ethanol solution to make the concentration of thioredoxin peroxidase 0.03 mol/mL; spin-coating thioredoxin peroxidase solution on the surface of the pristine PTCDI-$C_8$ thin film organic field effect transistor, and annealing at 60° C. for 1 h, and solidifying into a film, thus obtaining a thioredoxin peroxidase thin film with a thickness of 100 nm.

The difference between this embodiment and Embodiment 1 is that thioredoxin peroxidase thin film is used instead of ascorbic acid thin film, and all other conditions are the same.

Embodiment 10

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving 2-(2-hydroxy-5-methylphenyl)benzotriazole in ethanol solution to make the concentration of 2-(2-hydroxy-5-methylphenyl)benzotriazole 0.03 mol/mL; spin-coating 2-(2-hydroxy-5-methylphenyl)benzotriazole solution on the surface of the pristine PTCDI-$C_8$ thin film organic field effect transistor, and annealing at 60° C. for 1 h, and solidifying into a film, thus obtaining a 2-(2-hydroxy-5-methylphenyl)benzotriazole thin film with a thickness of 100 nm.

The difference between this embodiment and Embodiment 1 is that 2-(2-hydroxy-5-methylphenyl)benzotriazole thin film is used instead of ascorbic acid thin film, and all other conditions are the same.

Embodiment 11

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving 2,4-dihydroxy benzophenone in ethanol solution to make the concentration of 2,4-dihydroxy benzophenone 0.03 mol/mL; spin-coating 2,4-dihydroxy benzophenone solution on the surface of the pristine PTCDI-$C_8$ thin film organic field effect transistor, and annealing at 60° C. for 1 h, and solidifying into a film, thus obtaining a 2,4-dihydroxy benzophenone thin film with a thickness of 100 nm.

The difference between this embodiment and Embodiment 1 is that 2,4-dihydroxy benzophenone thin film is used instead of ascorbic acid thin film, and all other conditions are the same.

Embodiment 12

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving ascorbic acid powder in ethanol solution to make the concentration of ascorbic acid 0.03 mol/mL; adding polyurethane into ascorbic acid solution and mixing (the mass ratio of polyurethane to solute antioxidant in ascorbic acid solution is 1:100), spin-coating the mixed solution of ascorbic acid and polyurethane on the surface of the pristine PTCDI-$C_8$ thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 1 is that blend thin film of polyurethane and ascorbic acid is used instead of ascorbic acid thin film, and all other conditions are the same.

Embodiment 13

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving ascorbic acid powder in ethanol solution to make the concentration of ascorbic acid 0.03 mol/mL; adding polystyrene into ascorbic acid solution and mixing (the mass ratio of polystyrene to solute ascorbic acid in ascorbic acid solution is 1:100), spin-coating the mixed solution of ascorbic acid and polystyrene on the surface of the pristine PTCDI-$C_8$ thin film organic field effect transistor, and annealing at 60° C. for 1 h, and solidifying into a film, thus obtaining a blend thin film of polystyrene and ascorbic acid with a thickness of 100 nm.

The difference between this embodiment and Embodiment 12 is that blend thin film of polystyrene and ascorbic acid is used instead of blend thin film of polyurethane and ascorbic acid, and all other conditions are the same.

Embodiment 14

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDI-$C_8$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDI-$C_8$ thin film organic field effect transistor; and
(5) dissolving ascorbic acid powder in ethanol solution to make the concentration of ascorbic acid 0.03 mol/mL; adding polyimide into ascorbic acid solution and mixing (the mass ratio of polyimide to solute ascorbic acid in ascorbic acid solution is 1:100), spin-coating the mixed solution of ascorbic acid and polyimide on the surface of the pristine PTCDI-$C_8$ thin film organic field effect transistor, and annealing at 60° C. for 1 h, and solidifying into a film, thus obtaining a blend thin film of polyimide and ascorbic acid with a thickness of 100 nm.

The difference between this embodiment and Embodiment 12 is that blend thin film of polyimide and ascorbic acid is used instead of blend thin film of polyurethane and ascorbic acid, and all other conditions are the same.

Embodiment 15

(1) taking a 500 μm-thick heavily doped silicon wafer as a grid electrode and silicon dioxide naturally oxidized on the surface of the heavily doped silicon wafer as a dielectric layer with a thickness of 300 nm;
(2) carrying out oxygen plasma treatment on a silicon wafer containing a silicon dioxide layer, for 5 min at a power of 50 watts (W); placing the treated silicon wafer in a drying oven with vacuum pressure of 0.1 MPa and temperature set at 120° C. for ODTS modification for 120 min, ultrasonically washing the modified silicon wafer in acetone, chloroform and ethanol solution for 15 min in sequence; placing in a drying oven with the temperature set at 110° C. for drying and annealing for 10 min, and cooling to room temperature;
(3) spin-coating the ODTS-modified silicon wafer with 5 mg/mL of N2200 chloroform solution by spin-coating at a spin-coating speed of 1000 rpm for 30 s to obtain the N2200 film with a thickness of 50 nm, placing the N2200 film on a hot stage with a temperature set at 150° C., annealing for 2 h, and cooling to room temperature;
(4) depositing a silver source and a drain electrode with a thickness of 20 nm on the organic semiconductor layer by evaporation at a rate of 0.1 Å/s to obtain the N2200 film organic field effect transistor; and
(5) dissolving ascorbic acid powder in ethanol solution to make the concentration of ascorbic acid 0.03 mol/mL; adding polyurethane into ascorbic acid solution and mixing (the mass ratio of polyurethane to solute ascorbic acid in ascorbic acid solution is 1:100), spin-coating the mixed solution of ascorbic acid and polyurethane on the surface of the pristine N2200 film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the dielectric layer is changed to ODTS, and the organic semiconductor N2200 film is prepared by spin coating, and other conditions are all the same.

Embodiment 16

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor C60 thin film on the surface of PS thin film by evaporation at a rate of 0.05 Å/s to a thickness of 100 nm;
(4) depositing a silver source and a drain electrode with a thickness of 20 nm on the organic semiconductor layer by evaporation at a rate of 0.1 Å/s to obtain the C60 thin film organic field effect transistor; and
(5) dissolving ascorbic acid powder in ethanol solution to make the concentration of ascorbic acid 0.03 mol/mL; adding polyurethane into ascorbic acid solution and mixing (the mass ratio of polyurethane to solute ascorbic acid in ascorbic acid solution is 1:100), spin-coating the mixed solution of ascorbic acid and polyurethane on the surface of the pristine C60 thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the organic semiconductor is changed to C60 thin film, and all other conditions are the same.

Embodiment 17

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDA thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the PTCDA thin film organic field effect transistor; and
(5) dissolving ascorbic acid powder in ethanol solution to make the concentration of ascorbic acid 0.03 mol/mL; adding polyurethane into antioxidant solution and mixing (the mass ratio of polyurethane to solute antioxidant in antioxidant solution is 1:100), spin-coating the mixed solution of ascorbic acid and polyurethane on the surface of the pristine PTCDA thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the organic semiconductor is changed to PTCDA thin film, and all other conditions are the same.

Embodiment 18

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor HAT-CN thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the HAT-CN thin film organic field effect transistor; and
(5) dissolving ascorbic acid powder in ethanol solution to make the concentration of ascorbic acid 0.03 mol/mL; adding polyurethane into ascorbic acid solution and mixing (the mass ratio of polyurethane to solute ascorbic acid in ascorbic acid solution is 1:100), spin-coating the mixed solution of ascorbic acid and polyurethane on the surface of the pristine HAT-CN thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the organic semiconductor is changed to HAT-CN thin film, and all other conditions are the same.

Embodiment 19

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 3 mg/mL BDPPV orthodichlorobenzene solution on the silicon wafer by spin-coating at a rotating speed of 2,000 rpm for 30 s to obtain BDPPV thin film with a thickness of 50 nm, placing the BDPPV thin film on a hot stage with a temperature set at 100° C., annealing for 15 h, and cooling to room temperature;
(3) depositing a silver source and a drain electrode with a thickness of 20 nm on the organic semiconductor layer by evaporation at a rate of 0.1 Å/s to obtain the BDPPV thin film organic field effect transistor; and
(4) dissolving ascorbic acid powder in ethanol solution to make the concentration of ascorbic acid 0.03 mol/mL; adding polyurethane into ascorbic acid solution and mixing (the mass ratio of polyurethane to solute ascorbic acid in ascorbic acid solution is 1:100), spin-coating the mixed solution of ascorbic acid and polyurethane on the surface of the pristine BDPPV thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the dielectric layer is changed and the organic semiconductor BDPPV thin film is prepared by spin coating, and other conditions are all the same.

Embodiment 20

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor $F_{16}CuPc$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the $F_{16}CuPc$ thin film organic field effect transistor; and
(5) dissolving ascorbic acid powder in ethanol solution to make the concentration of ascorbic acid 0.03 mol/mL; adding polyurethane into ascorbic acid solution and mixing (the mass ratio of polyurethane to solute ascorbic acid in ascorbic acid solution is 1:10), spin-coating the mixed solution of ascorbic acid and polyurethane on the surface of the pristine $F_{16}CuPc$ thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the organic semiconductor is replaced by $F_{16}CuPc$ thin film, and all other conditions are the same.

Embodiment 21

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor $PTCP-CH_2C_3F_7$ thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the $PTCP-CH_2C_3F_7$ thin film organic field effect transistor; and
(5) dissolving ascorbic acid powder in ethanol solution to make the concentration of antioxidant 0.03 mol/mL; adding polyurethane into ascorbic acid solution and mixing (the mass ratio of polyurethane to solute antioxidant in antioxidant solution is 1:100), spin-coating the mixed solution of ascorbic acid and polyurethane on the surface of the pristine $PTCP-CH_2C_3F_7$ thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the organic semiconductor is replaced by $PTCP-CH_2C_3F_7$ thin film, and all other conditions are the same.

Embodiment 22

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor DCyNTDA thin film on the surface of PS thin film by evaporation at a rate of 0.05 Å/s to a thickness of 20 nm;
(4) depositing a silver source and a drain electrode with a thickness of 20 nm on the organic semiconductor layer by evaporation at a rate of 0.1 Å/s to obtain the DCyNTDA thin film organic field effect transistor; and
(5) dissolving ascorbic acid powder in ethanol solution to make the concentration of ascorbic acid 0.03 mol/mL; adding polyurethane into antioxidant solution and mixing (the mass ratio of polyurethane to solute antioxidant in ascorbic acid solution is 1:100), spin-coating the mixed solution of ascorbic acid and polyurethane on the surface of the pristine DCyNTDA thin film organic field effect transistor, and annealing at 60° C. for 1 h, and solidifying into a film, thus obtaining a blend thin film of polyurethane and ascorbic acid with a thickness of 100 nm.

The difference between this embodiment and Embodiment 12 is that the organic semiconductor is replaced by DCyNTDA thin film, and all other conditions are the same.

Embodiment 23

(1) taking a 500 μm-thick heavily doped silicon wafer as a grid electrode and silicon dioxide naturally oxidized on the surface of the heavily doped silicon wafer as a dielectric layer with a thickness of 300 nm;
(2) carrying out oxygen plasma treatment on a silicon wafer containing a silicon dioxide layer, for 5 min at a power of 50 W; placing the treated silicon wafer in a drying oven with vacuum pressure of 0.1 MPa and temperature set at 120° C. for ODTS modification for 120 min, ultrasonically washing the modified silicon wafer in acetone, chloroform and ethanol solution for 15 min in sequence; placing in a drying oven with the temperature set at 110° C. for drying and annealing for 10 min, and cooling to room temperature;
(3) transferring single-layer $MOS_2$ to the ODTS-modified silicon wafer by stripping method, where the thickness of $MOS_2$ layer is 0.7 nm;
(4) attaching a silver source and a drain electrode with a thickness of 20 nm on a single-layer $MoS_2$ by the transfer gold film method to obtain a single-crystal $MoS_2$ field effect transistor; and
(5) dissolving ascorbic acid powder in ethanol solution to make the concentration of antioxidant 0.03 mol/mL; adding polyurethane into ascorbic acid solution and mixing (the mass ratio of polyurethane to solute antioxidant in antioxidant solution is 1:100), spin-coating the mixed solution of ascorbic acid and polyurethane on the surface of the single-crystal $MoS_2$ field effect transistor, and forming into a film at room temperature, thus obtaining a blend thin film of polyurethane and ascorbic acid with a thickness of 100 nm.

Comparative Embodiment 1

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor $PTCDI-C_8$ thin film on the surface of PS thin film by evaporation at a rate of 0.05 Å/s to a thickness of 20 nm; and
(4) depositing a silver source and a drain electrode with a thickness of 20 nm on the organic semiconductor layer by evaporation at a rate of 0.1 Å/s to obtain the $PTCDI-C_8$ thin film organic field effect transistor.

The difference between Comparative embodiment 1 and Embodiment 1 is that the ascorbic acid thin film is not spin-coated on the surface of $PTCDI-C_8$ thin film, and all other conditions are the same; the difference from Embodiment 2 is that the semiconductor layer is not doped with ascorbic acid molecules, and all other conditions are the same.

Comparative Embodiment 2

(1) taking a 500 μm-thick heavily doped silicon wafer as a grid electrode and silicon dioxide naturally oxidized on the surface of the heavily doped silicon wafer as a dielectric layer with a thickness of 300 nm;
(2) carrying out oxygen plasma treatment on a silicon wafer containing a silicon dioxide layer, for 5 min at a power of 50 W; placing the treated silicon wafer in a drying oven with vacuum pressure of 0.1 MPa and temperature set at 120° C. for ODTS modification for 120 min, ultrasonically washing the modified silicon wafer in acetone, chloroform and ethanol solution for 15 min in sequence; placing in a drying oven with the temperature set at 110° C. for drying and annealing for 10 min, and cooling to room temperature;
(3) spin-coating the ODTS-modified silicon wafer with 5 mg/mL of N2200 chloroform solution by spin-coating at a spin-coating speed of 1000 rpm for 30 s to obtain the N2200 film with a thickness of 50 nm, placing the N2200 film on a hot stage with a temperature set at 150° C., annealing for 2 h, and cooling to room temperature; and
(4) depositing a silver source and a drain electrode with a thickness of 20 nm on the organic semiconductor layer by evaporation at a rate of 0.1 Å/s to obtain the N2200 film organic field effect transistor.

Comparative Embodiment 3

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor C60 thin film on the surface of PS thin film by evaporation at a rate of 0.05 Å/s to a thickness of 100 nm; and
(4) depositing a silver source and a drain electrode with a thickness of 20 nm on the organic semiconductor layer by evaporation at a rate of 0.1 Å/s to obtain the C60 thin film organic field effect transistor.

Comparative Embodiment 4

(1) taking a 500 μm-thick heavily doped silicon wafer as a grid electrode and silicon dioxide naturally oxidized on the surface of the heavily doped silicon wafer as a dielectric layer with a thickness of 300 nm;
(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;
(3) depositing the organic semiconductor PTCDA thin film on the surface of PS thin film by evaporation at a rate of 0.05 Å/s to a thickness of 20 nm; and
(4) depositing a silver source and a drain electrode with a thickness of 20 nm on the organic semiconductor layer by evaporation at a rate of 0.1 Å/s to obtain the PTCDA thin film organic field effect transistor.

Comparative Embodiment 5

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor HAT-CN thin film on the surface of PS thin film by evaporation at a rate of 0.05 Å/s to a thickness of 20 nm; and (4) depositing a silver source and a drain electrode with a thickness of 20 nm on the organic semiconductor layer by evaporation at a rate of 0.1 Å/s to obtain the HAT-CN thin film organic field effect transistor.

Comparative Embodiment 6

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 3 mg/mL BDPPV orthodichlorobenzene solution on the silicon wafer by spin-coating at a rotating speed of 2,000 rpm for 30 s to obtain BDPPV thin film with a thickness of 50 nm, placing the BDPPV thin film on a hot stage with a temperature set at 100° C., annealing for 15 h, and cooling to room temperature;

(3) depositing a silver source and a drain electrode with a thickness of 20 nm on the organic semiconductor layer by evaporation at a rate of 0.1 Å/s to obtain the BDPPV thin film organic field effect transistor.

Comparative embodiment 7

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor $F_{16}CuPc$ thin film on the surface of PS thin film by evaporation at a rate of 0.05 Å/s to a thickness of 20 nm; and (4) depositing a silver source and a drain electrode with a thickness of 20 nm on the organic semiconductor layer by evaporation at a rate of 0.1 Å/s to obtain the $F_{16}CuPc$ thin film organic field effect transistor.

Comparative Embodiment 8

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor $PTCP-CH_2C_3F_7$ thin film on the surface of PS thin film by evaporation at a rate of 0.05 Å/s to a thickness of 20 nm; and (4) depositing a silver source and a drain electrode with a thickness of 20 nm on the organic semiconductor layer by evaporation at a rate of 0.1 Å/s to obtain the $PTCP-CH_2C_3F_7$ thin film organic field effect transistor.

Comparative Embodiment 9

(1) taking a 500 μm-thick heavily doped silicon wafer as a grid electrode and silicon dioxide naturally oxidized on the surface of the heavily doped silicon wafer as a dielectric layer with a thickness of 300 nm;

(2) spin-coating 5 mg/mL polystyrene chloroform solution on the surface of the dielectric layer at a rotating speed of 2,000 rpm for 30 s, and annealing at 60° C. for 30 min to obtain a PS thin film with a thickness of 25 nm;

(3) depositing the organic semiconductor DCyNTDA thin film on the surface of PS thin film by evaporation at a rate of 0.05 Å/s to a thickness of 20 nm; and (4) depositing a silver source and a drain electrode with a thickness of 20 nm on the organic semiconductor layer by evaporation at a rate of 0.1 Å/s to obtain the DCyNTDA thin film organic field effect transistor.

Comparative embodiment 10

(1) taking a 500 μm-thick heavily doped silicon wafer as a grid electrode and silicon dioxide naturally oxidized on the surface of the heavily doped silicon wafer as a dielectric layer with a thickness of 300 nm;

(2) carrying out oxygen plasma treatment on a silicon wafer containing a silicon dioxide layer, for 5 min at a power of 50 W; placing the treated silicon wafer in a drying oven with vacuum pressure of 0.1 MPa and temperature set at 120° C. for ODTS modification for 120 min, ultrasonically washing the modified silicon wafer in acetone, chloroform and ethanol solution for 15 min in sequence; placing in a drying oven with the temperature set at 110° C. for drying and annealing for 10 min, and cooling to room temperature;

(3) transferring single-layer $MOS_2$ to the ODTS-modified silicon wafer by stripping method, where the thickness of $MOS_2$ layer is 0.7 nm; and (4) attaching a silver source and a drain electrode with a thickness of 20 nm on a single-layer $MoS_2$ by the transfer gold film method to obtain a single-crystal $MoS_2$ field effect transistor.

1. Comparison of Structural Schematic Diagram

Figure 1B:
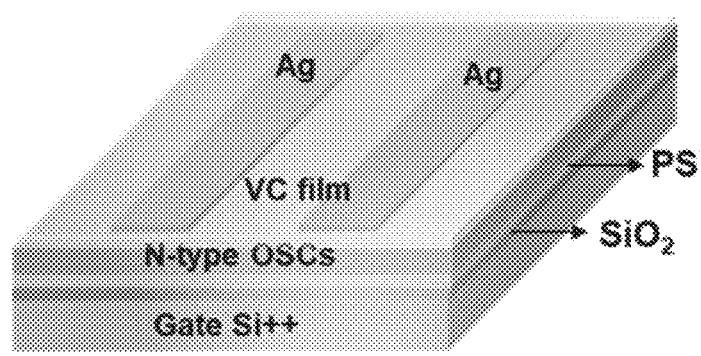
FIG. 1B is the PTCDI-$C_8$ thin film organic field effect transistor with ascorbic acid thin film on the surface prepared in embodiment 1.
Figure 1C:
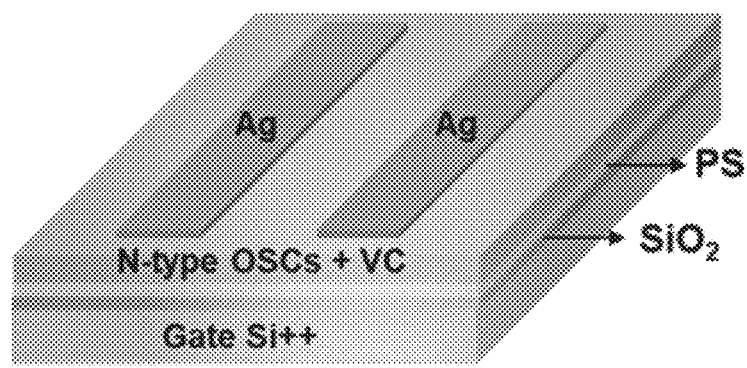
FIG. 1C is the structural diagram of the organic field effect transistor doped with ascorbic acid molecules in the PTCDI-$C_8$ semiconductor layer prepared in Embodiment 2 under environmental conditions.
Figure 1D:
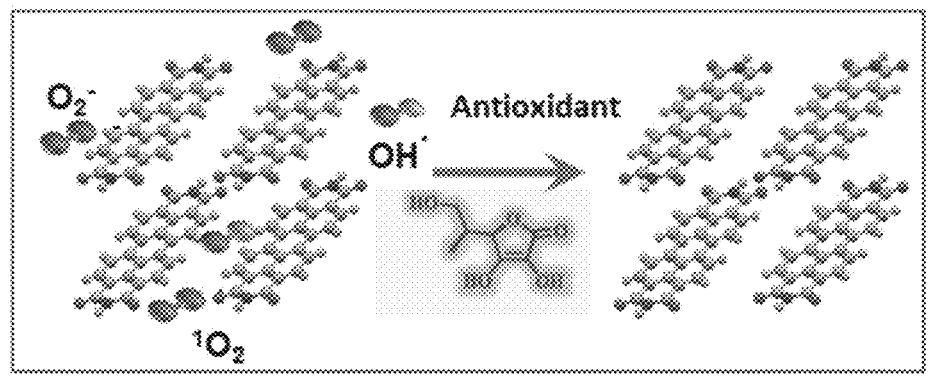
FIG. 1D shows a microscopic process of antioxidant scavenging oxygen and related species in organic semiconductors.

The structural schematic diagram of the pristine $PTCDI-C_8$ thin film organic field effect transistor prepared in Comparative embodiment 1 is shown in FIG. 1A, and the structural schematic diagram of the $PTCDI-C_8$ thin film organic field effect transistor with ascorbic acid thin film on surface prepared in Embodiment 1 is shown in FIG. 1B, the organic field effect transistor doped with ascorbic acid molecules in the $PTCDI-C_8$ semiconductor layer prepared in embodiment 2 under environmental conditions is shown in FIG. 1C, and a microscopic process of antioxidant scavenging oxygen and related species in organic semiconductors is shown in FIG. 1D. It can be observed from FIG. 1A-FIG. 1D that through constructing the antioxidant layer on the surface of the N-type semiconductor device or constructing the blend thin film of antioxidant and the N-type semiconductor molecules, the antioxidant may not only remove the oxygen and related species that have been added into the N-type semiconductor, and eliminate the related trap state in the forbidden band, but also prevent the N-type semiconductor from further degrading, so that the electrical properties such as the mobility of the N-type semiconductor device are improved, and the operation stability and long-term storage stability are improved.

2. Electrical Characteristic Curves

Figure 2A:
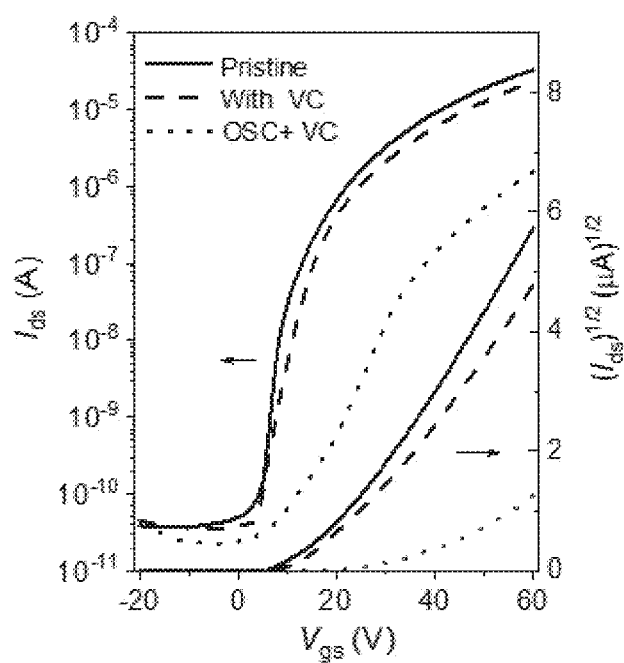
FIG. 2A is transfer curves of the pristine PTCDI-$C_8$ thin film organic field effect transistor prepared in Comparative embodiment 1, PTCDI-$C_8$ thin film organic field effect transistor with ascorbic acid thin film prepared in Embodiment 1 and PTCDI-$C_8$ thin film organic field effect transistor doped with ascorbic acid molecules in the semiconductor layer prepared in Embodiment 2.
Figure 2B:
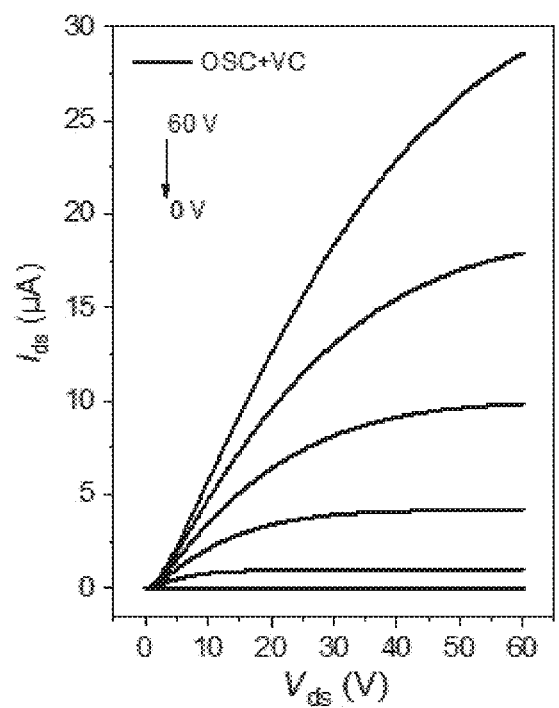
FIG. 2B is an output curve of PTCDI-$C_8$ thin film organic field effect transistor doped with ascorbic acid molecules in the semiconductor layer prepared in Embodiment 2.
Figure 2C:
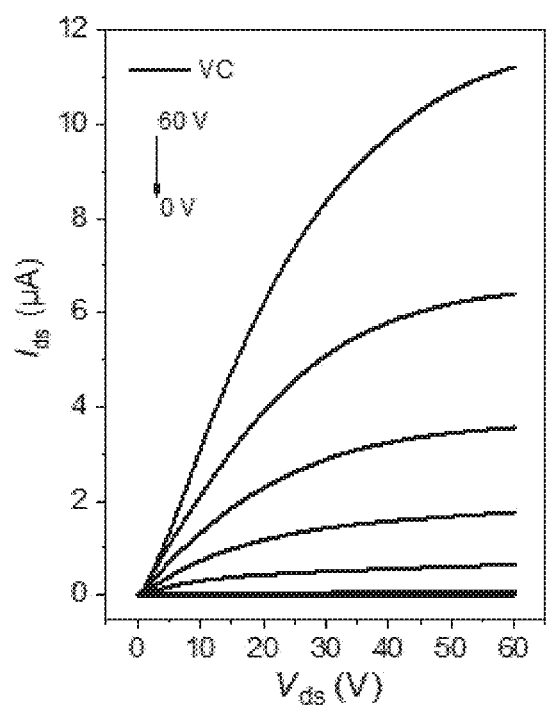
FIG. 2C is an output curve of PTCDI-$C_8$ thin film organic field effect transistor treated by adding ascorbic acid thin film prepared in Embodiment 1.
Figure 2D:
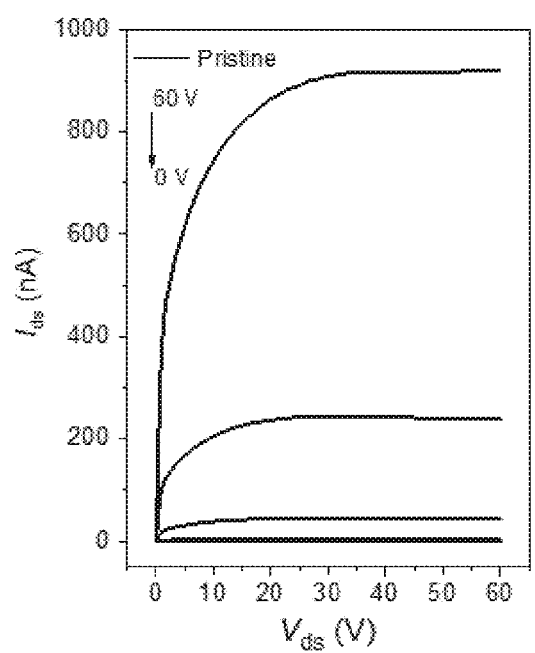
FIG. 2D is an output curve of the pristine PTCDI-$C_8$ thin film organic field effect transistor prepared in Comparative embodiment 1.

The electrical properties of the pristine PTCDI-$C_8$ thin film organic field effect transistor prepared in Comparative embodiment 1, the PTCDI-$C_8$ thin film organic field effect transistor with ascorbic acid thin film constructed on surface prepared in Embodiment 1 and the PTCDI-$C_8$ thin film organic field effect transistor doped with ascorbic acid molecules prepared in embodiment 2 are tested under environmental conditions. The electrical characteristic curves of the three organic field effect transistors are shown in FIG. 2A-FIG. 2D, where FIG. 2A is transfer curves of the pristine PTCDI-$C_8$ thin film organic field effect transistor prepared in Comparative embodiment 1, PTCDI-$C_8$ thin film organic field effect transistor treated by adding ascorbic acid thin film prepared in Embodiment 1 and PTCDI-$C_8$ thin film organic field effect transistor doped with ascorbic acid molecules in the semiconductor layer prepared in Embodiment 2, FIG. 2B is an output curve of Embodiment 2, FIG. 2C is an output curve of Embodiment 1, and FIG. 2D is an output curve of Comparative embodiment 1. As can be seen from FIG. 2A-FIG. 2D, the initial electrical signal of the untreated pristine PTCDI-$C_8$ thin film organic field effect transistor made in Comparative embodiment 1 is not high, and the initial electrical signals of the PTCDI-$C_8$ thin film organic field effect transistor with ascorbic acid thin film constructed on surface prepared in Embodiment 1 and the PTCDI-$C_8$ thin film organic field effect transistor doped with ascorbic acid molecules prepared in Embodiment 2 are obviously improved compared with the untreated device.

3. Stability of Electrochemical Parameters

Figure 3A:
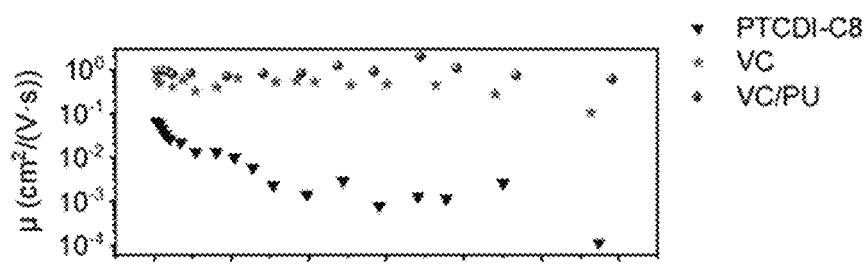
FIG. 3A shows carrier mobility (p) of the pristine PTCDI-$C_8$ thin film organic field effect transistor prepared in Comparative embodiment 1, PTCDI-$C_8$ thin film organic field effect transistor with ascorbic acid thin film prepared in Embodiment 1 and PTCDI-$C_8$ thin film organic field effect transistor with semiconductor layer doped with ascorbic acid molecules prepared in Embodiment 2 under environmental conditions.
Figure 3B:
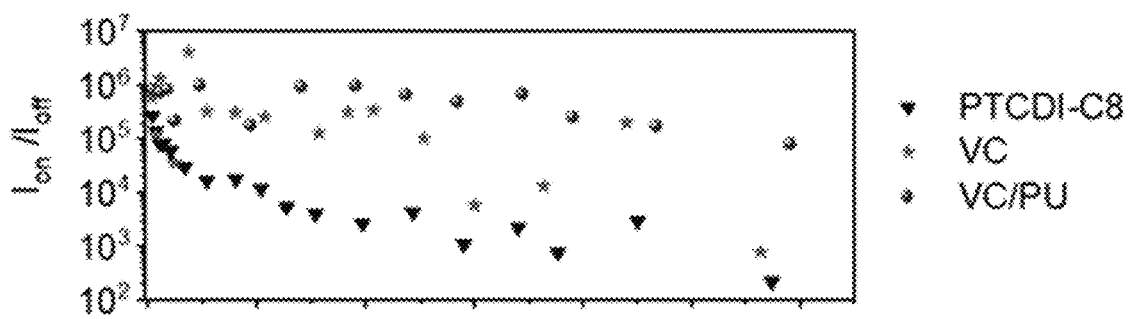
FIG. 3B shows $I_{on}/I_{off}$ of the pristine PTCDI-$C_8$ thin film organic field effect transistor prepared in Comparative embodiment 1, PTCDI-$C_8$ thin film organic field effect transistor with ascorbic acid thin film prepared in Embodiment 1 and PTCDI-$C_8$ thin film organic field effect transistor with semiconductor layer doped with ascorbic acid molecules prepared in Embodiment 2 under environmental conditions.
Figure 3C:
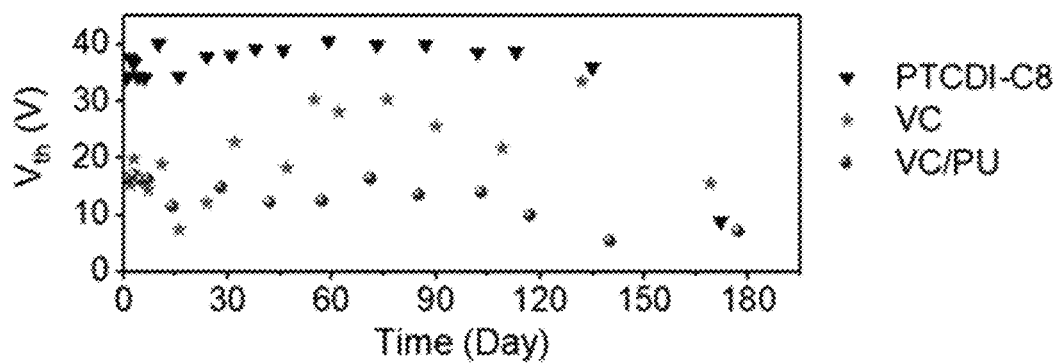
FIG. 3C is the threshold voltage ($V_{th}$) of the pristine PTCDI-$C_8$ thin film organic field effect transistor prepared in Comparative embodiment 1, PTCDI-$C_8$ thin film organic field effect transistor with ascorbic acid thin film prepared in Embodiment 1 and PTCDI-$C_8$ thin film organic field effect transistor with semiconductor layer doped with ascorbic acid molecules prepared in Embodiment 2 under environmental conditions.

The time-varying property parameters of the pristine PTCDI-$C_8$ thin film organic field effect transistor prepared in Comparative embodiment 1, the PTCDI-$C_8$ thin film organic field effect transistor with ascorbic acid thin film constructed on surface prepared in Embodiment 1 and the PTCDI-$C_8$ thin film organic field effect transistor doped with ascorbic acid molecules prepared in Embodiment 2 are tested under environmental conditions. Results are shown in FIG. 3A-FIG. 3C, where FIG. 3A shows carrier mobility, FIG. 3B is $I_{on}/I_{off}$ and FIG. 3C is the threshold voltage ($V_{th}$). As can be seen from FIG. 3A-FIG. 3C, after the untreated pristine PTCDI-$C_8$ thin film organic field effect transistor prepared in Comparative embodiment 1 is stored for a long time, all the electrical parameters are obviously are decreased, while the PTCDI-$C_8$ thin film organic field effect transistor with ascorbic acid thin film on surface prepared in Embodiment 1 and the PTCDI-$C_8$ thin film organic field effect transistor doped with ascorbic acid molecules prepared in Embodiment 2 are very stable after long-term storage.

4. Operating Stability and Switching Cycle Stability

Figure 4A:
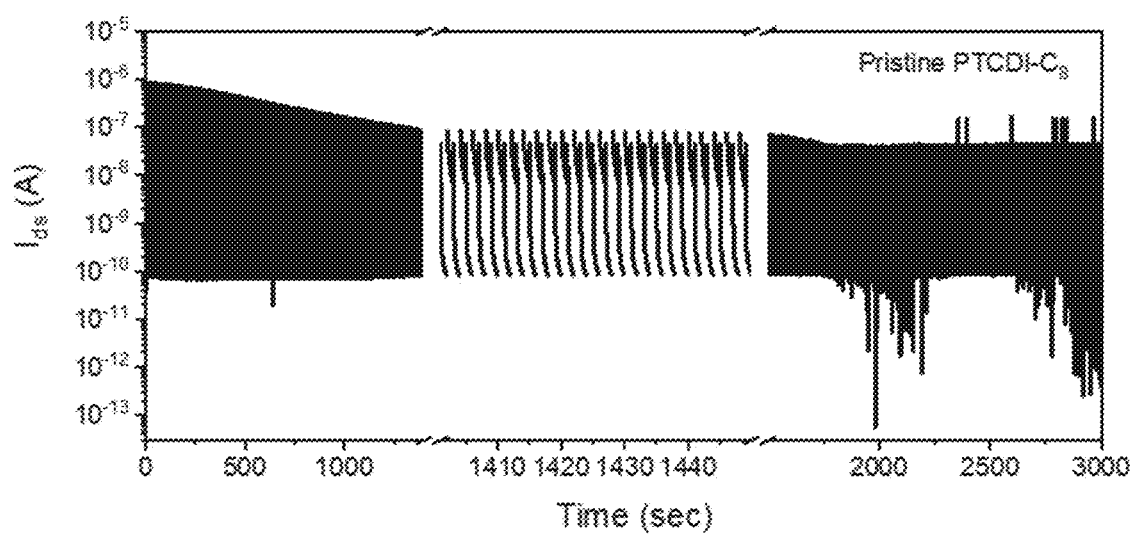
FIG. 4A shows a switching cycle curve of the pristine PTCDI-$C_8$ thin film organic field effect transistor prepared in Comparative embodiment 1 under environmental conditions.
Figure 4B:
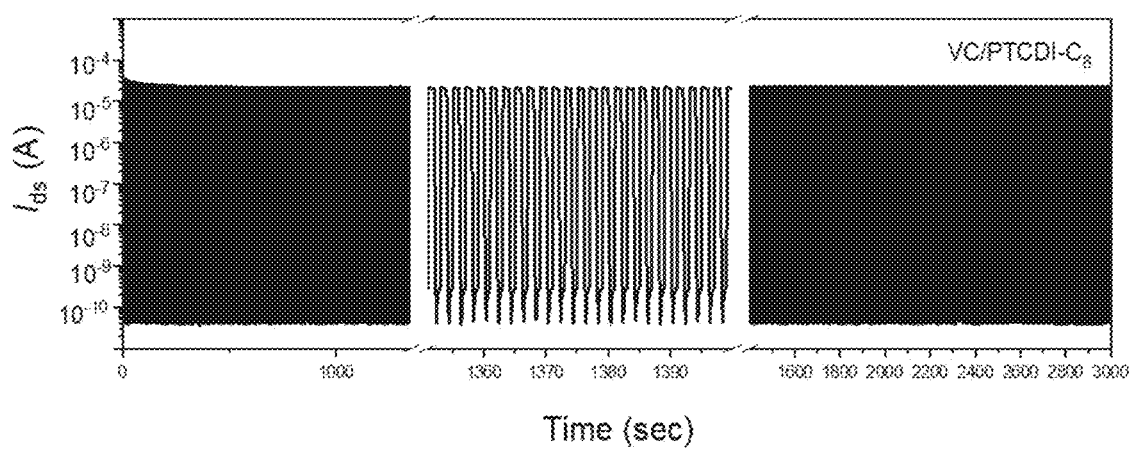
FIG. 4B shows a switching cycle curve of PTCDI-$C_8$ thin film organic field effect transistor with ascorbic acid thin film prepared in Embodiment 1 under environmental conditions.
Figure 4C:
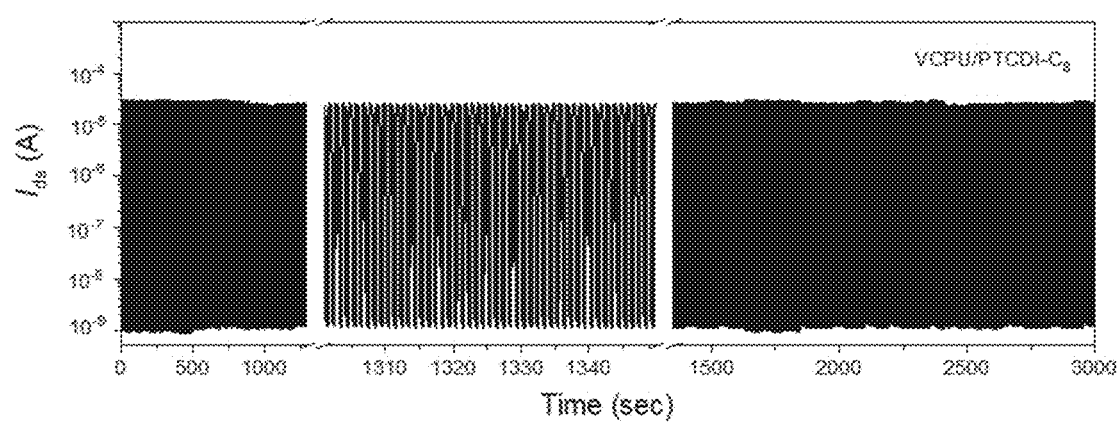
FIG. 4C shows a switching cycle curve of PTCDI-$C_8$ thin film organic field effect transistor with semiconductor layer doped with ascorbic acid molecules prepared in Embodiment 2 under environmental conditions.

The switching cycle characteristics of the pristine PTCDI-$C_8$ thin film organic field effect transistor prepared in Comparative embodiment 1, the PTCDI-$C_8$ thin film organic field effect transistor with ascorbic acid thin film constructed on surface prepared in Embodiment 1 and the PTCDI-$C_8$ thin film organic field effect transistor doped with ascorbic acid molecules prepared in Embodiment 2 are tested under environmental conditions. The switching cycle curves of the three transistors are shown in FIG. 4A-FIG. 4C, and the illustrations are the amplification curves at the beginning, middle and end of the cycle test, where FIG. 4A is Comparative embodiment 1, FIG. 4B is Embodiment 1 and FIG. 4C is Embodiment 2. As can be seen from FIG. 4A-FIG. 4C, the untreated pristine PTCDI-$C_8$ thin film organic field effect transistor prepared in Comparative embodiment 1 has low operating stability and poor switching cycle stability, so it cannot be applied in practice. The operating stability and switching cycle stability of the PTCDI-$C_8$ thin film organic field effect transistor with ascorbic acid thin film constructed on surface prepared in Embodiment 1 and the PTCDI-$C_8$ thin film organic field effect transistor doped with ascorbic acid molecules prepared in Embodiment 2 are obviously improved, and the stability of Embodiment 2 is consistent with that of Embodiment 1.

Figure 5A:
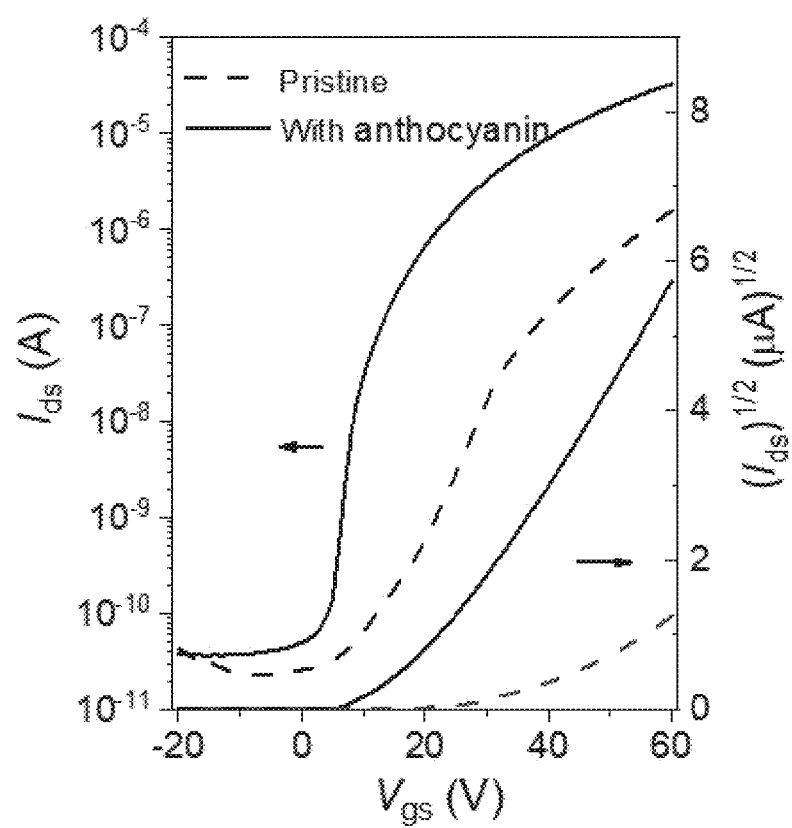
FIG. 5A shows transfer curves of untreated PTCDI-$C_8$ thin film organic field effect transistor and PTCDI-$C_8$ thin film organic field effect transistor treated with astaxanthin.
Figure 5B:
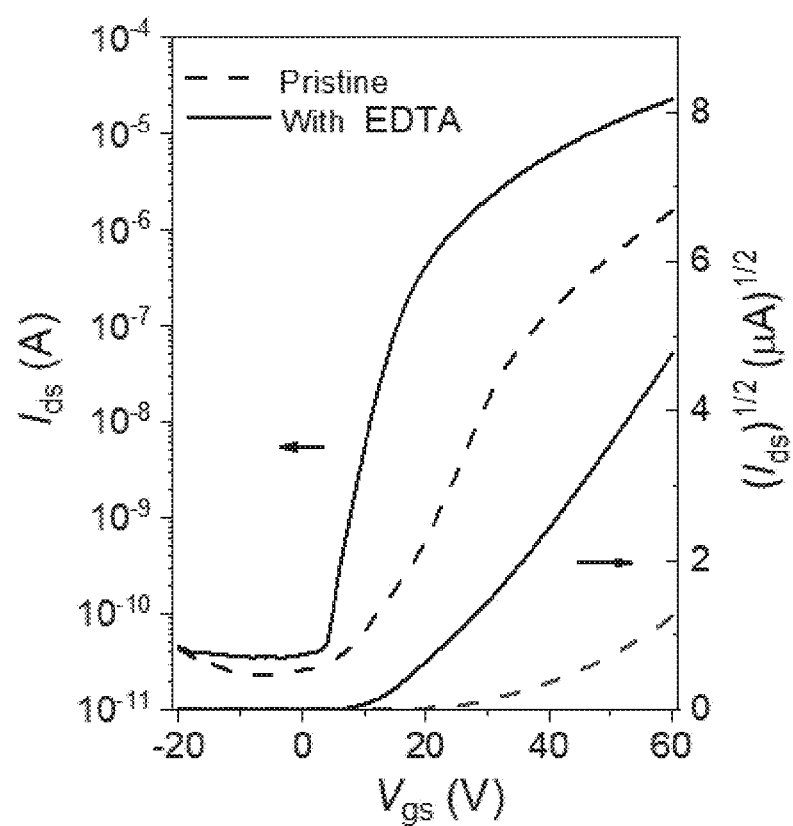
FIG. 5B shows transfer curves of untreated PTCDI-$C_8$ thin film organic field effect transistor and PTCDI-$C_8$ thin film organic field effect transistor treated with ethylene diamine tetraacetic acid (EDTA).
Figure 5C:
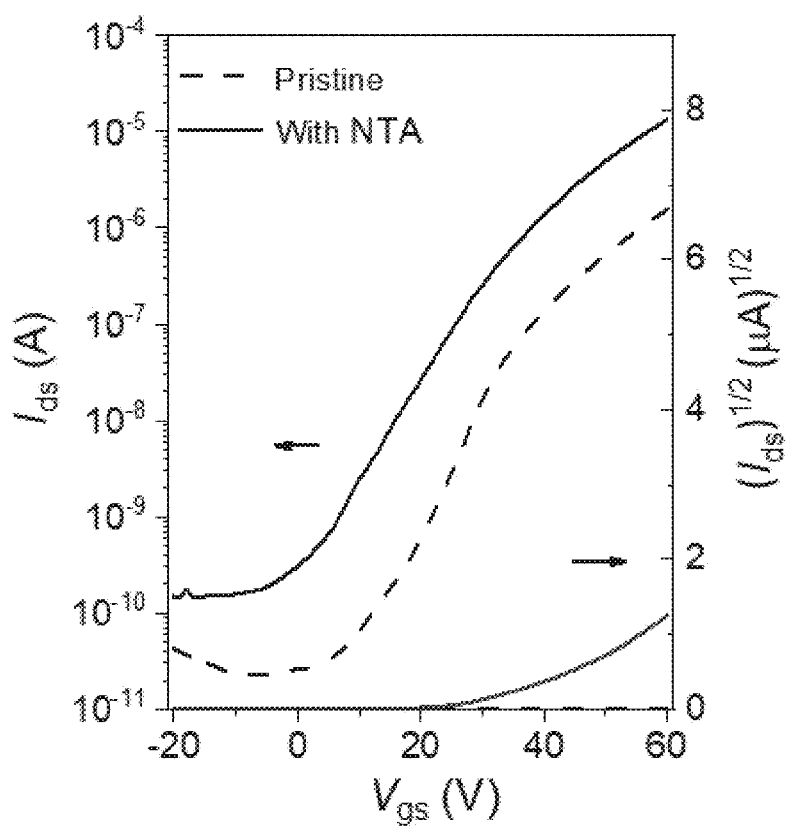
FIG. 5C shows transfer curves of untreated PTCDI-$C_8$ thin film organic field effect transistor and PTCDI-$C_8$ thin film organic field effect transistor treated with aminotriacetic acid (NTA).
Figure 5D:
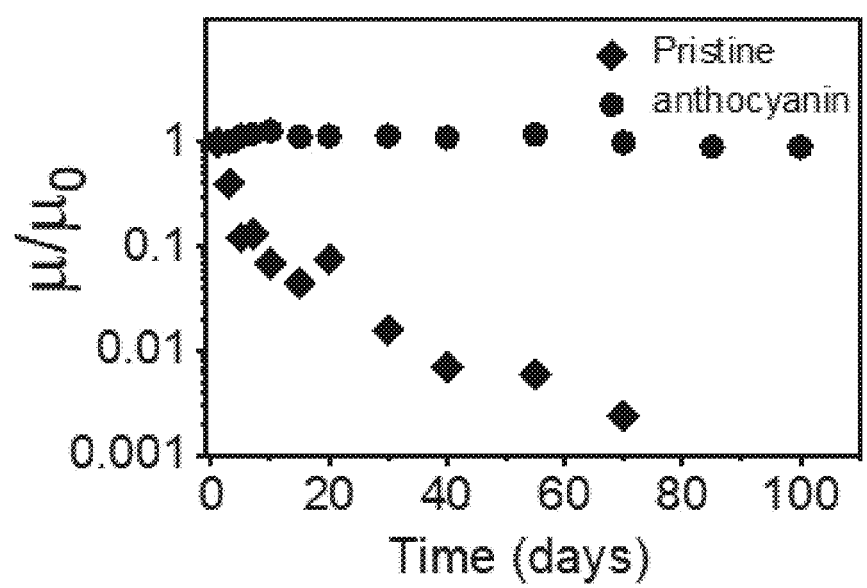
FIG. 5D shows time-varying property parameters of untreated PTCDI-$C_8$ thin film organic field effect transistor and PTCDI-$C_8$ thin film organic field effect transistor treated with astaxanthin under air condition.
Figure 5E:
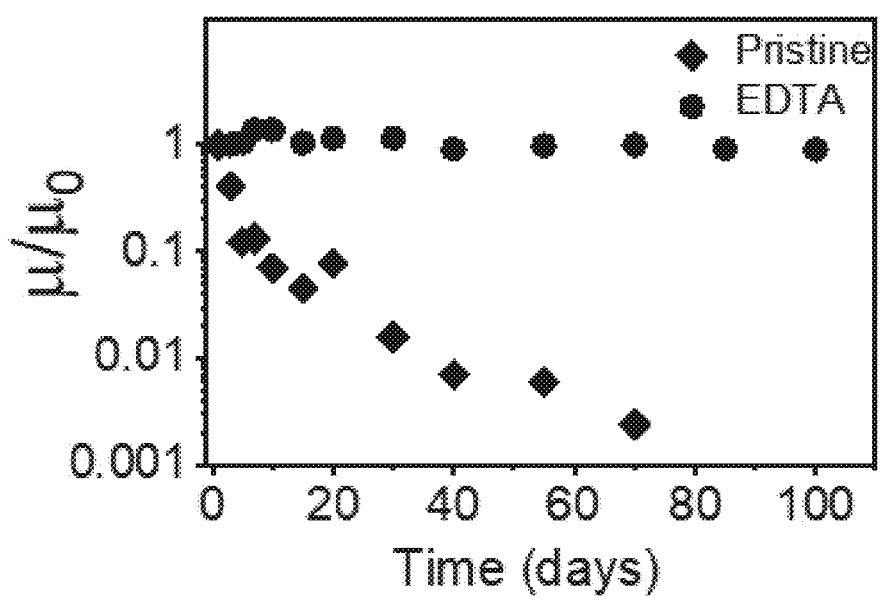
FIG. 5E shows time-varying property parameters of untreated PTCDI-$C_8$ thin film organic field effect transistor and PTCDI-$C_8$ thin film organic field effect transistor treated with EDTA under air condition.
Figure 5F:
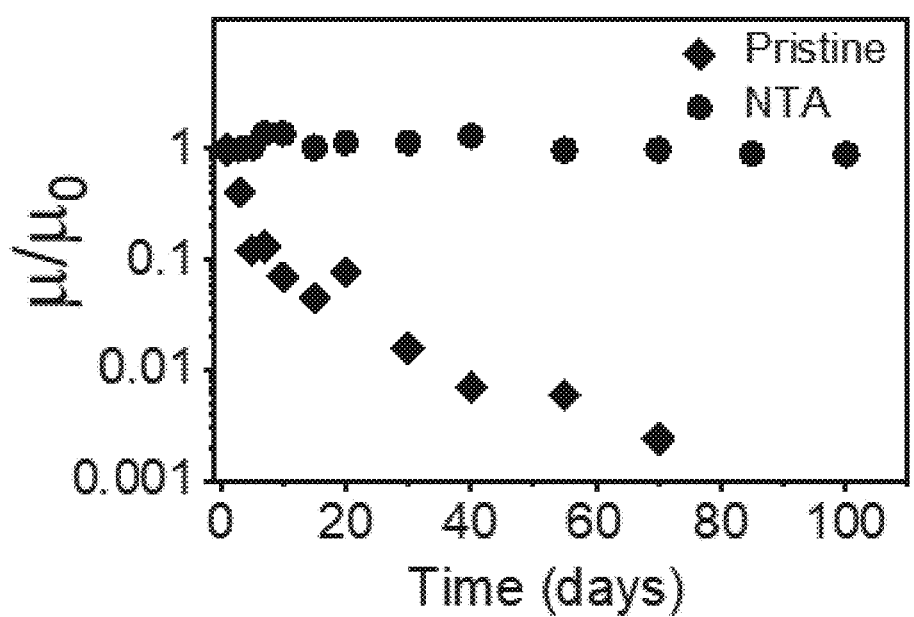
FIG. 5F shows time-varying property parameters of untreated PTCDI-$C_8$ thin film organic field effect transistor and PTCDI-$C_8$ thin film organic field effect transistor treated with aminotriacetic acid under air condition.
Figure 5G:
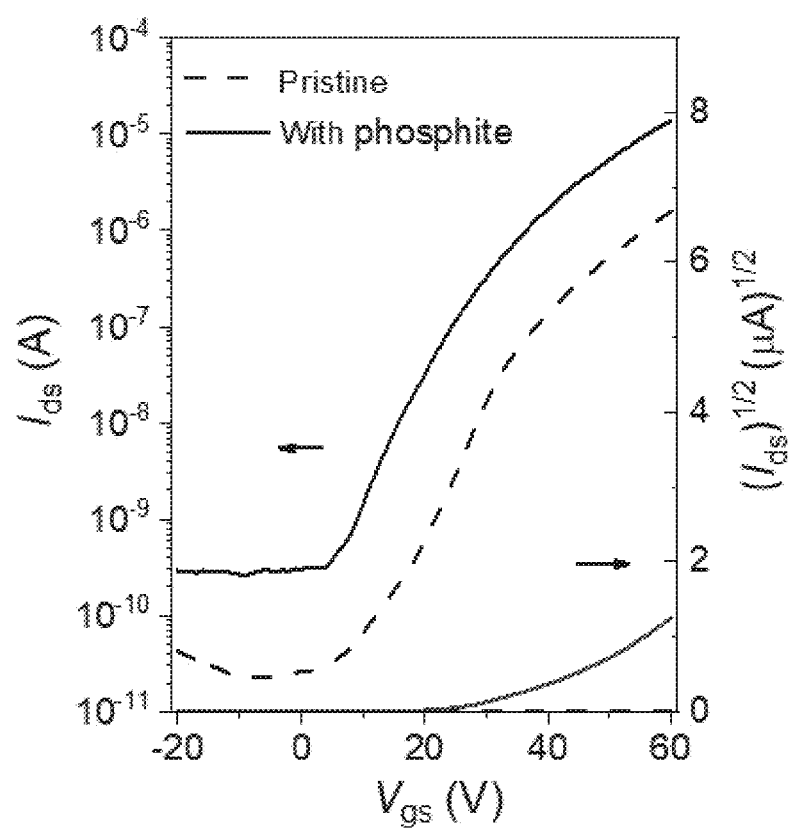
FIG. 5G shows transfer curves of untreated PTCDI-$C_8$ thin film organic field effect transistor and PTCDI-$C_8$ thin film organic field effect transistor treated with subphosphite ester.
Figure 5H:
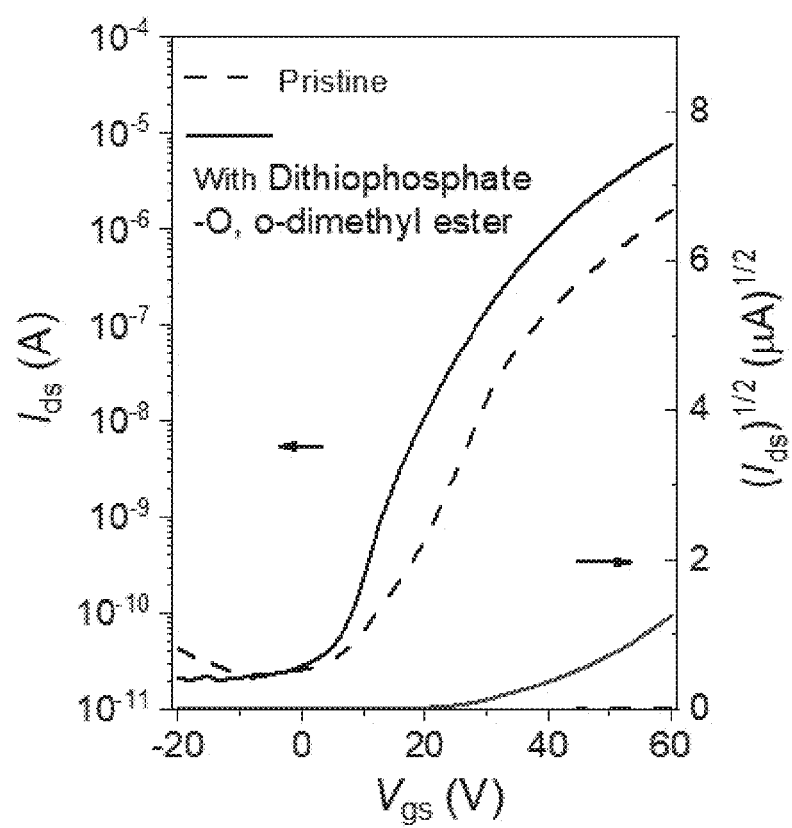
FIG. 5H shows transfer curves of untreated PTCDI-$C_8$ thin film organic field effect transistor and PTCDI-$C_8$ thin film organic field effect transistor treated with dithiophosphoric acid-O,O-dimethyl ester.
Figure 5I:
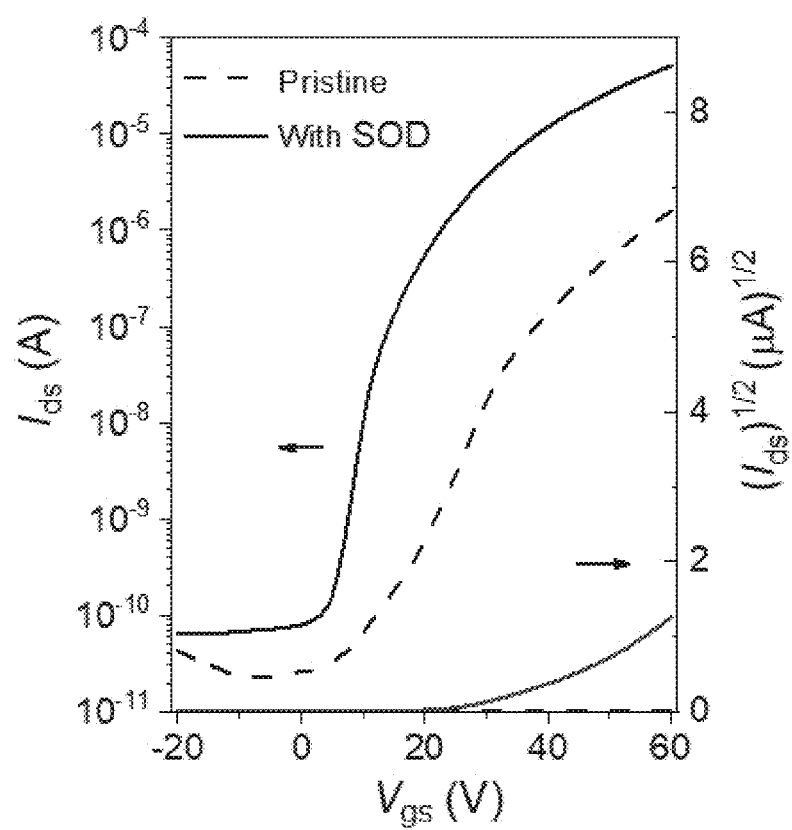
FIG. 5I shows transfer curves of untreated PTCDI-$C_8$ thin film organic field effect transistor and PTCDI-$C_8$ thin film organic field effect transistor treated with superoxide dismutase.
Figure 5J:
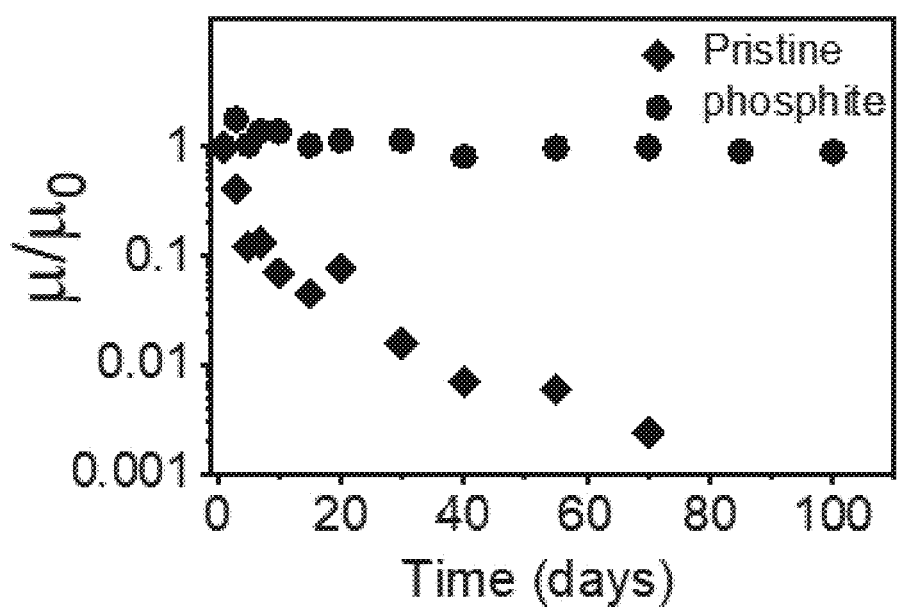
FIG. 5J shows time-varying property parameters of untreated PTCDI-$C_8$ thin film organic field effect transistor and PTCDI-$C_8$ thin film organic field effect transistor treated with subphosphite ester under air condition.
Figure 5K:
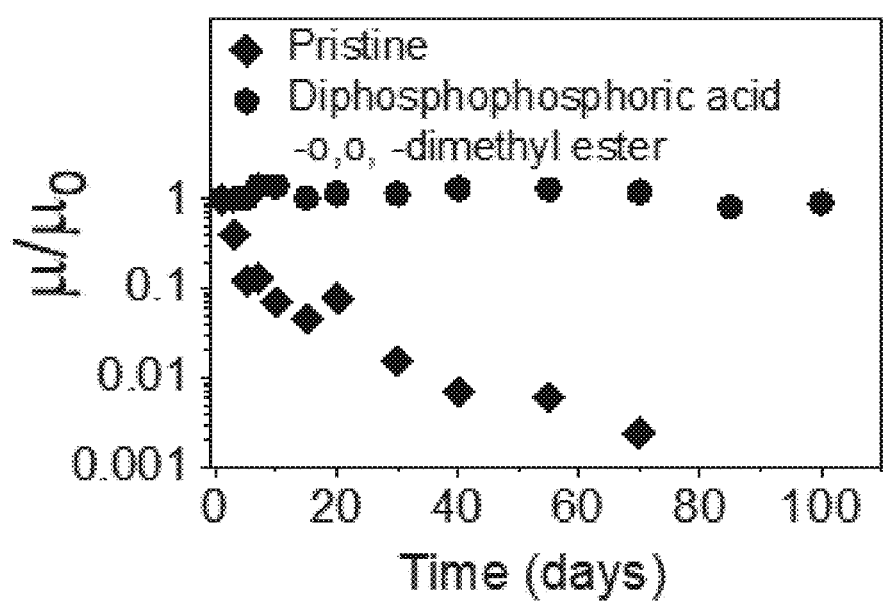
FIG. 5K shows time-varying property parameters of untreated PTCDI-$C_8$ thin film organic field effect transistor and PTCDI-$C_8$ thin film organic field effect transistor treated with dithiophosphoric acid-O,O-dimethyl ester under air condition.
Figure 5L:
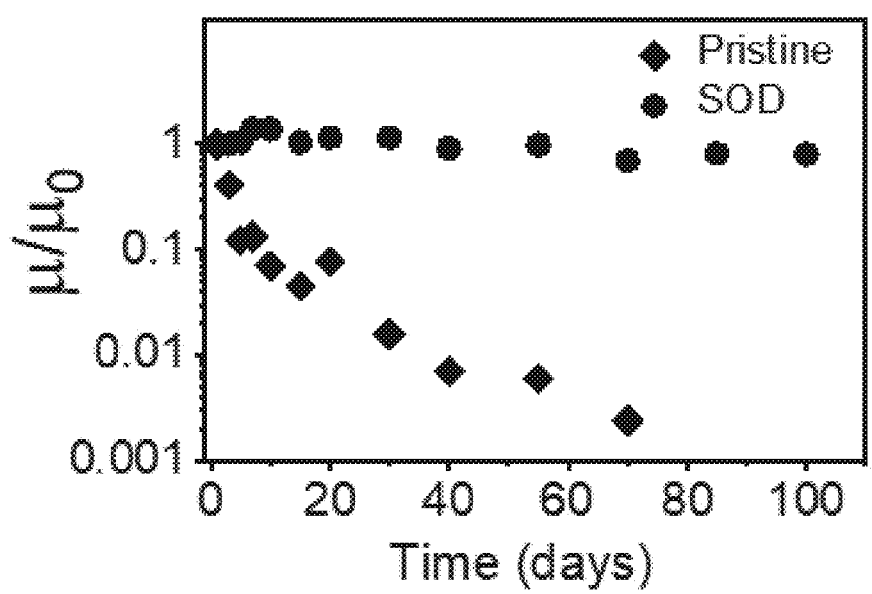
FIG. 5L shows time-varying property parameters of untreated PTCDI-$C_8$ thin film organic field effect transistor and PTCDI-$C_8$ thin film organic field effect transistor treated with superoxide dismutase under air condition.
Figure 5M:
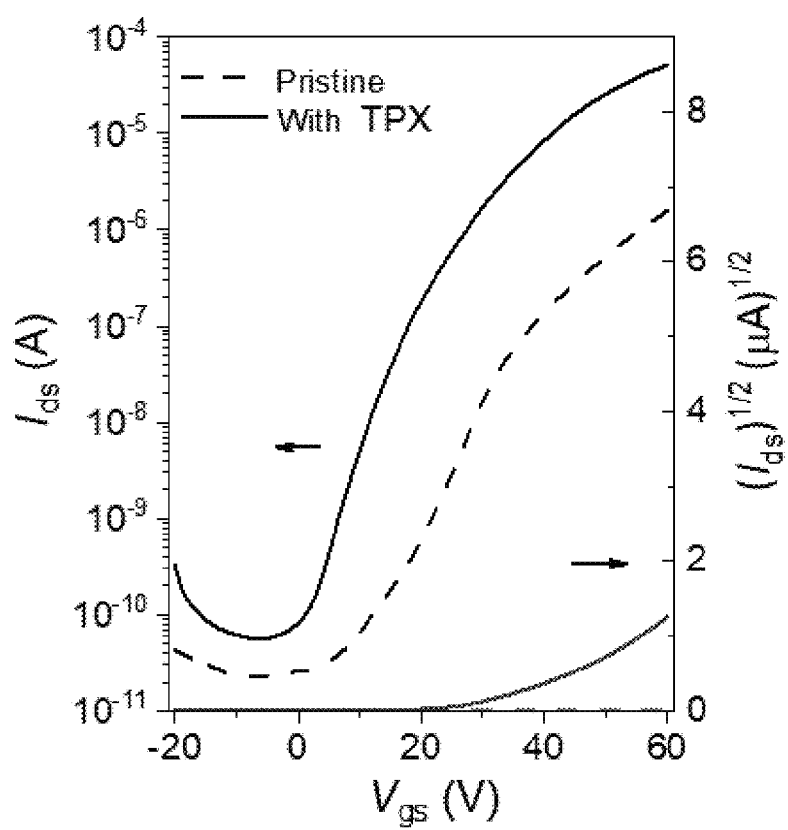
FIG. 5M shows transfer curves of untreated PTCDI-$C_8$ thin film organic field effect transistor and PTCDI-$C_8$ thin film organic field effect transistor treated with thioredoxin peroxidase.
Figure 5N:
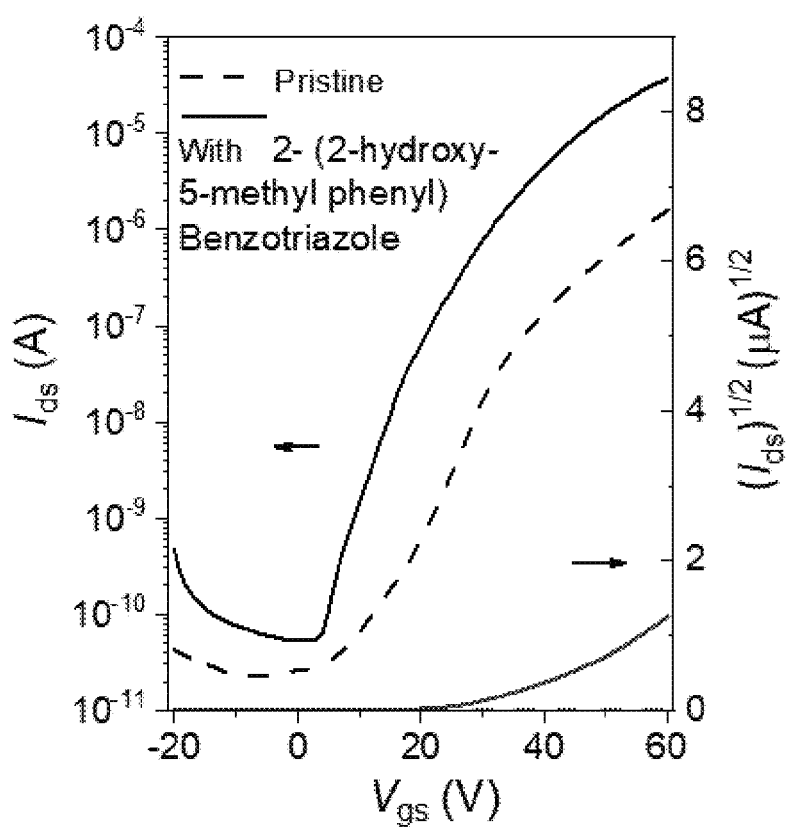
FIG. 5N shows transfer curves of untreated PTCDI-$C_8$ thin film organic field effect transistor and PTCDI-$C_8$ thin film organic field effect transistor treated with 2-(2-hydroxy-5-methylphenyl)benzotriazole.
Figure 5O:
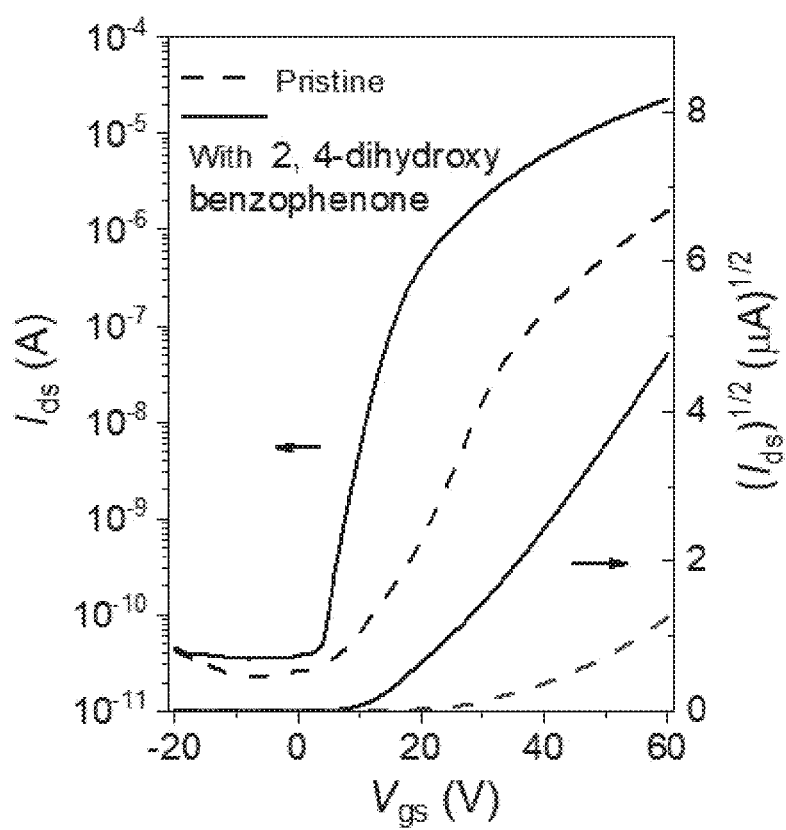
FIG. 5O shows transfer curves of untreated PTCDI-$C_8$ thin film organic field effect transistor and PTCDI-$C_8$ thin film organic field effect transistor treated with 2,4-dihydroxy benzophenone.
Figure 5P:
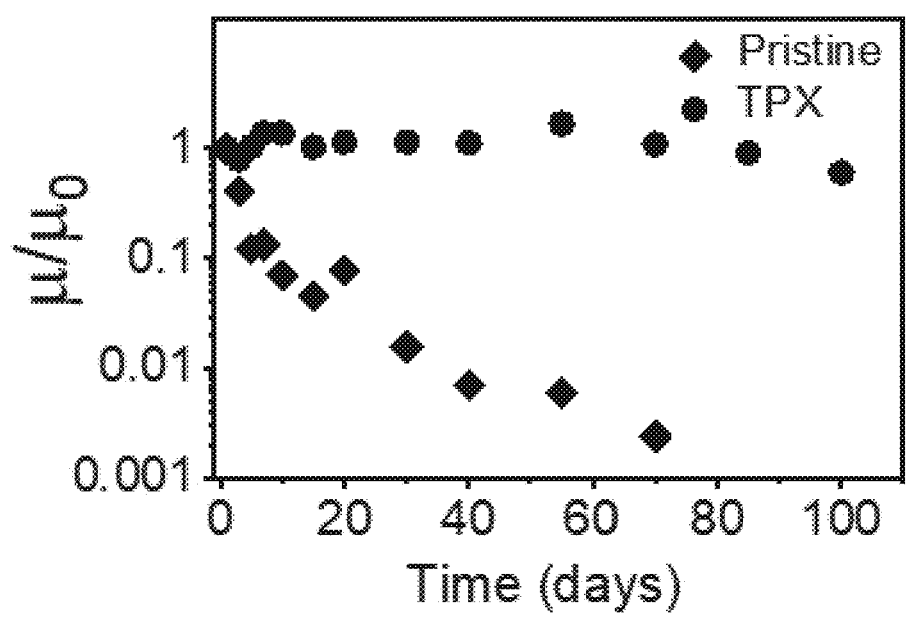
FIG. 5P shows time-varying property parameters of untreated PTCDI-$C_8$ thin film organic field effect transistor and PTCDI-$C_8$ thin film organic field effect transistor treated with thioredoxin peroxidase under air condition.
Figure 5Q:
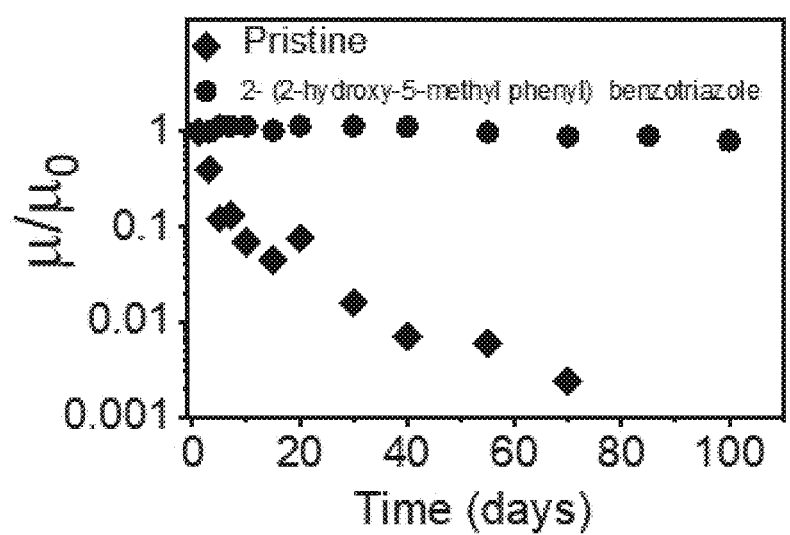
FIG. 5Q shows time-varying property parameters of untreated PTCDI-$C_8$ thin film organic field effect transistor and PTCDI-$C_8$ thin film organic field effect transistor treated with 2-(2-hydroxy-5-methylphenyl) under air condition.
Figure 5R:
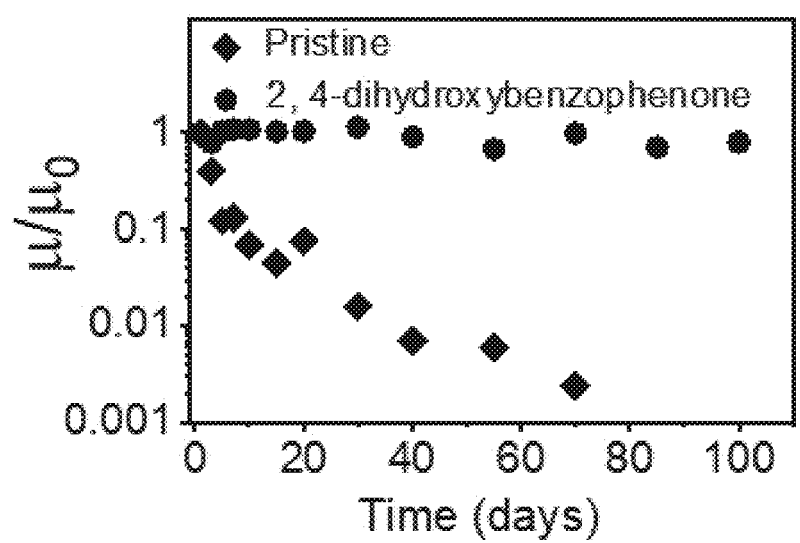
FIG. 5R shows time-varying property parameters of untreated PTCDI-$C_8$ thin film organic field effect transistor and PTCDI-$C_8$ thin film organic field effect transistor treated with 2,4-dihydroxy benzophenone under air condition.

5. Universality of Antioxidant Molecules to Improve the Property and Stability of N-Type Semiconductor Devices The time-varying electrical properties and property parameters of Embodiments 3-11 and Comparative embodiment 1 under environmental conditions are tested, and the results are shown in FIG. 5A-FIG. 5R. FIG. 5A shows transfer curves of untreated (Comparative embodiment 2) PTCDI-$C_8$ thin film organic field effect transistor and PTCDI-$C_8$ thin film organic field effect transistor treated with astaxanthin (Embodiment 3). FIG. 5B shows transfer curves of untreated (Comparative embodiment 2) PTCDI-$C_8$ thin film organic field effect transistor and PTCDI-$C_8$ thin film organic field effect transistor treated with ethylene diamine tetraacetic acid (Embodiment 4). FIG. 5C shows transfer curves of untreated (Comparative embodiment 2) PTCDI-$C_8$ thin film organic field effect transistor and PTCDI-$C_8$ thin film organic field effect transistor treated with aminotriacetic acid (Embodiment 5). FIG. 5G shows transfer curves of untreated (Comparative embodiment 2) PTCDI-$C_8$ thin film organic field effect transistor and PTCDI-$C_8$ thin film organic field effect transistor treated with subphosphite ester (Embodiment 6). FIG. 5H shows transfer curves of untreated (Comparative embodiment 2) PTCDI-$C_8$ thin film organic field effect transistor and PTCDI-$C_8$ thin film organic field effect transistor treated with dithiophosphoric acid-O,O-dimethyl ester (Embodiment 7). FIG. 5I shows transfer curves of untreated (Comparative embodiment 2) PTCDI-$C_8$ thin film organic field effect transistor and PTCDI-$C_8$ thin film organic field effect transistor treated with superoxide dismutase (Embodiment 8). FIG. 5M shows transfer curves of untreated (Comparative embodiment 2) PTCDI-$C_8$ thin film organic field effect transistor and PTCDI-$C_8$ thin film organic field effect transistor treated with thioredoxin peroxidase (Embodiment 9). FIG. 5N shows transfer curves of untreated (Comparative embodiment 2) PTCDI-$C_8$ thin film organic field effect transistor and PTCDI-$C_8$ thin film organic field effect transistor treated with 2-(2-hydroxy-5-methylphenyl)benzotriazole (Embodiment 10). FIG. 5O shows transfer curves of untreated (Comparative embodiment 2) PTCDI-$C_8$ thin film organic field effect transistor and PTCDI-$C_8$ thin film organic field effect transistor treated with 2,4-dihydroxy benzophenone (Embodiment 11). FIG. 5D shows time-varying property parameters of untreated PTCDI-$C_8$ thin film organic field effect transistor and PTCDI-$C_8$ thin film organic field effect transistor treated with astaxanthin under air condition. FIG. 5E shows time-varying property parameters of untreated PTCDI-$C_8$ thin film organic field effect transistor and PTCDI-$C_8$ thin film organic field effect transistor treated with EDTA under air condition. FIG. 5F shows time-varying property parameters of untreated PTCDI-$C_8$ thin film organic field effect transistor and PTCDI-$C_8$ thin film organic field effect transistor treated with aminotriacetic acid under air condition. FIG. 5J shows time-varying property parameters of untreated PTCDI-$C_8$ thin film organic field effect transistor and PTCDI-$C_8$ thin film organic field effect transistor treated with subphosphite ester under air condition. FIG. 5K shows time-varying property parameters of untreated PTCDI-$C_8$ thin film organic field effect transistor and PTCDI-$C_8$ thin film organic field effect transistor treated with dithiophosphoric acid-O,O-dimethyl ester under air condition. FIG. 5L shows time-varying property parameters of untreated PTCDI-$C_8$ thin film organic field effect transistor and PTCDI-$C_8$ thin film organic field effect transistor treated with superoxide dismutase under air condition. FIG. 5P shows time-varying property parameters of untreated PTCDI-$C_8$ thin film organic field effect transistor and PTCDI-$C_8$ thin film organic field effect transistor treated with thioredoxin peroxidase under air condition. FIG. 5Q shows time-varying property parameters of untreated PTCDI-$C_8$ thin film organic field effect transistor and PTCDI-$C_8$ thin film organic field effect transistor treated with 2-(2-hydroxy-5-methylphenyl) under air condition. FIG. 5R shows time-varying property parameters of untreated PTCDI-$C_8$ thin film organic field effect transistor and PTCDI-$C_8$ thin film organic field effect transistor treated with 2,4-dihydroxy benzophenone under air condition. As can be seen from FIG. 5A-FIG. 5R, the initial electrical properties of the organic field effect transistors treated with antioxidant are obviously stronger than those of the corresponding pristine devices not treated with antioxidant, and the organic field effect transistors treated with antioxidant remain stable for a long time.

6. The Influence of Polyurethane on the Morphology of Ascorbic Acid Thin Film

Figure 6A:
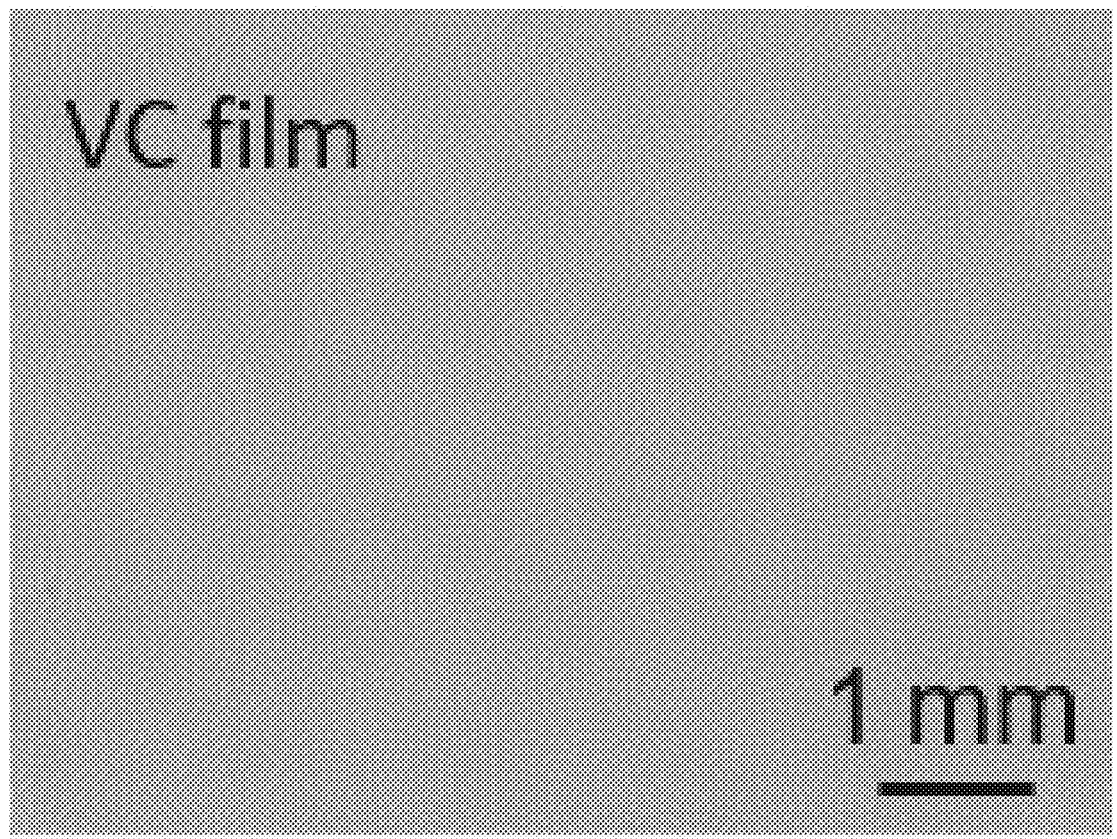
FIG. 6A is an optical image of a pristine pure antioxidant thin film.
Figure 6B:
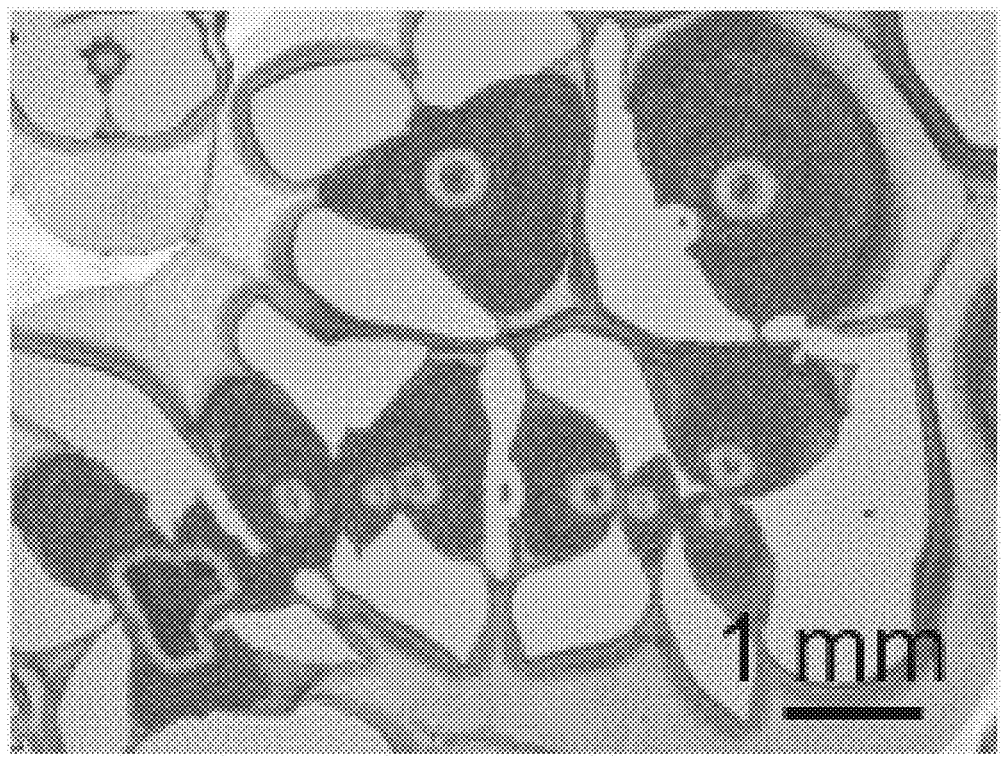
FIG. 6B is an optical image of a pure antioxidant thin film stored in atmospheric environment for 2 weeks.
Figure 6C:
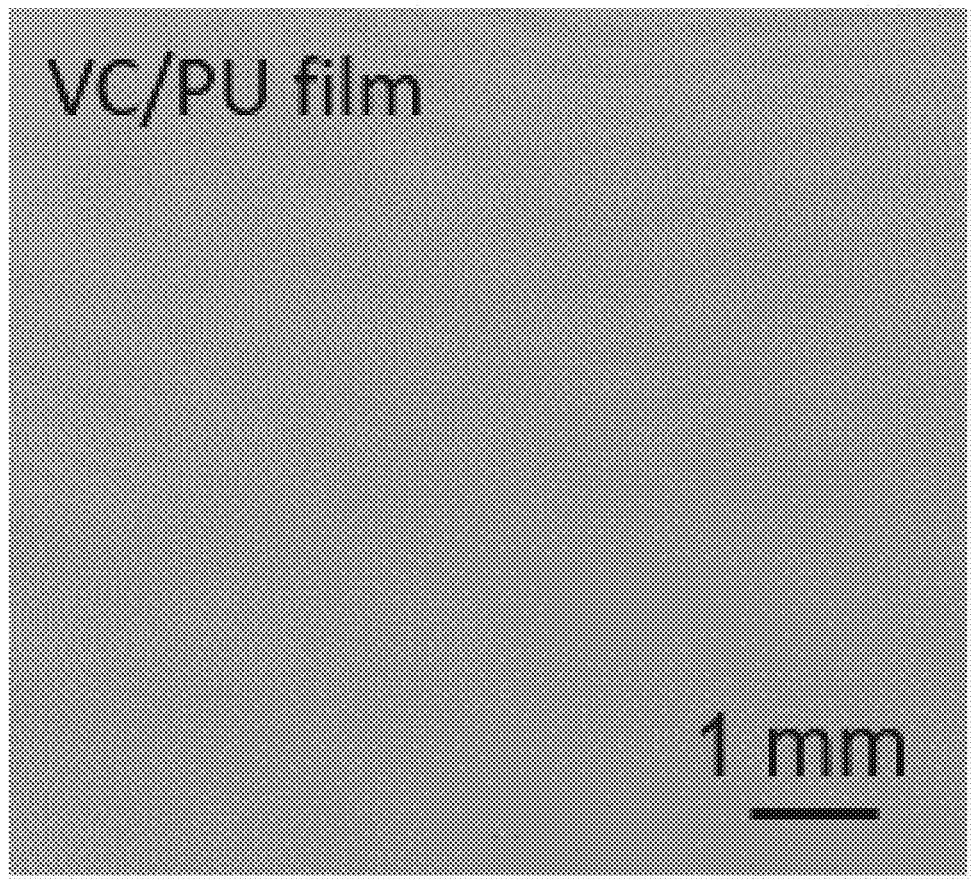
FIG. 6C is an optical image of a pristine blend thin film of antioxidant and polyurethane.
Figure 6D:
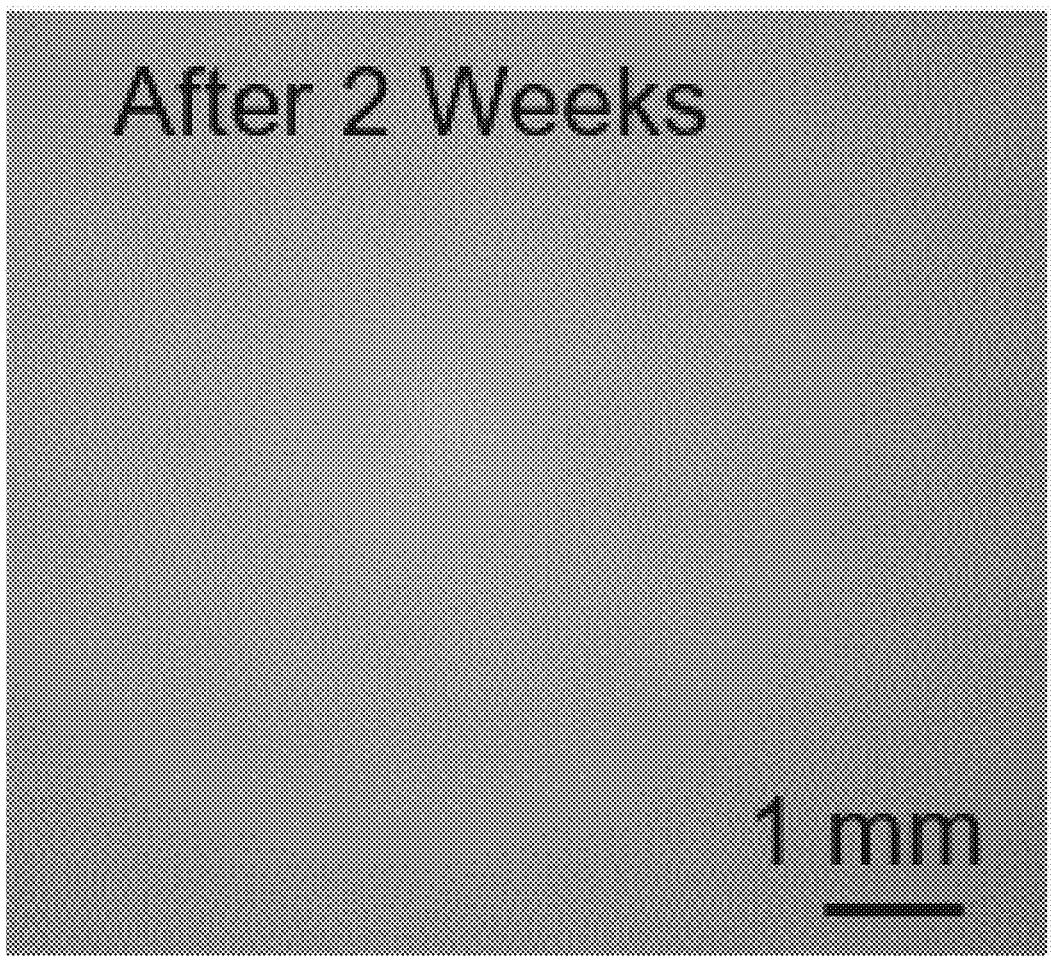
FIG. 6D is an optical image of the blend thin film of antioxidant and polyurethane stored in atmospheric environment for 2 weeks.
Figure 6E:
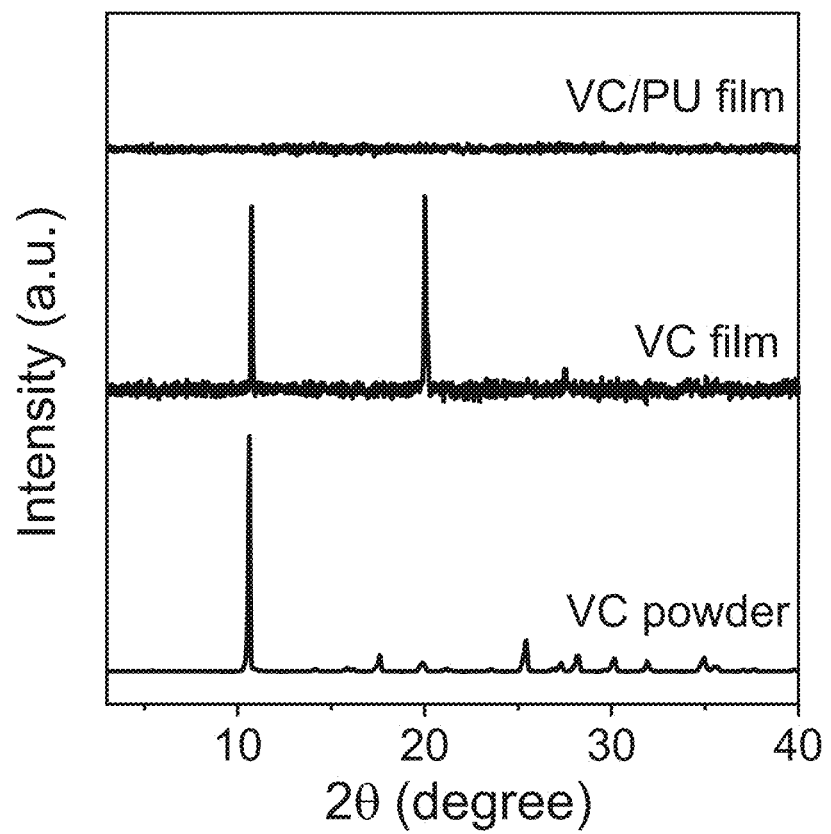
FIG. 6E is an X-ray diffraction patterns of antioxidant powder, antioxidant thin film and blend thin film of antioxidant and polyurethane.

The morphological changes of pure ascorbic acid thin film and blend thin film of ascorbic acid and polyurethane are shown in FIG. 6A-FIG. 6E, where FIG. 6A is an optical image of a pristine pure ascorbic acid thin film, FIG. 6B is an optical image of a pure ascorbic acid thin film stored in atmospheric environment for 2 weeks, FIG. 6C is an optical image of a pristine blend thin film of ascorbic acid and polyurethane, FIG. 6D is an optical image of the blend thin film of ascorbic acid and polyurethane stored in atmospheric environment for 2 weeks, and FIG. 6E is an X-ray diffraction patterns of ascorbic acid powder, ascorbic acid thin film, and blend thin film of ascorbic acid and polyurethane. As can be seen from FIG. 6A-FIG. 6E, obviously, the antioxidant thin film without adding polyurethane crystallizes obviously after 2 weeks; due to the addition of polyurethane, the blend thin film of ascorbic acid and polyurethane is stored in the atmospheric environment for 2 weeks, and the film is still uniform through optical images. In addition, FIG. 6E shows the X-ray diffraction patterns of ascorbic acid powder, ascorbic acid thin film and the blend thin film of ascorbic acid and polyurethane. With the addition of polyurethane, there is no peak of ascorbic acid in the ascorbic acid thin film, which proves that the blend thin film of ascorbic acid and polyurethane does not crystallize.

7. The Universality of Polymer

Figure 7A:
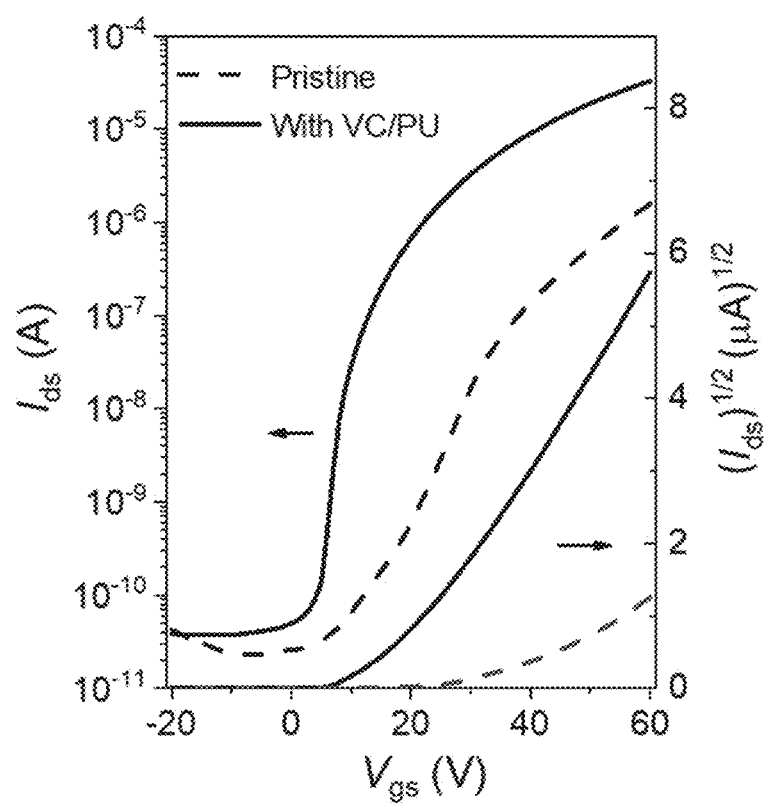
FIG. 7A is the transfer curves of untreated (Comparative embodiment 1) PTCDI-$C_8$ thin film organic field effect transistor and PTCDI-$C_8$ thin film organic field effect transistor treated with blend thin film of ascorbic acid and polyurethane (Embodiment 12) under environmental conditions.
Figure 7B:
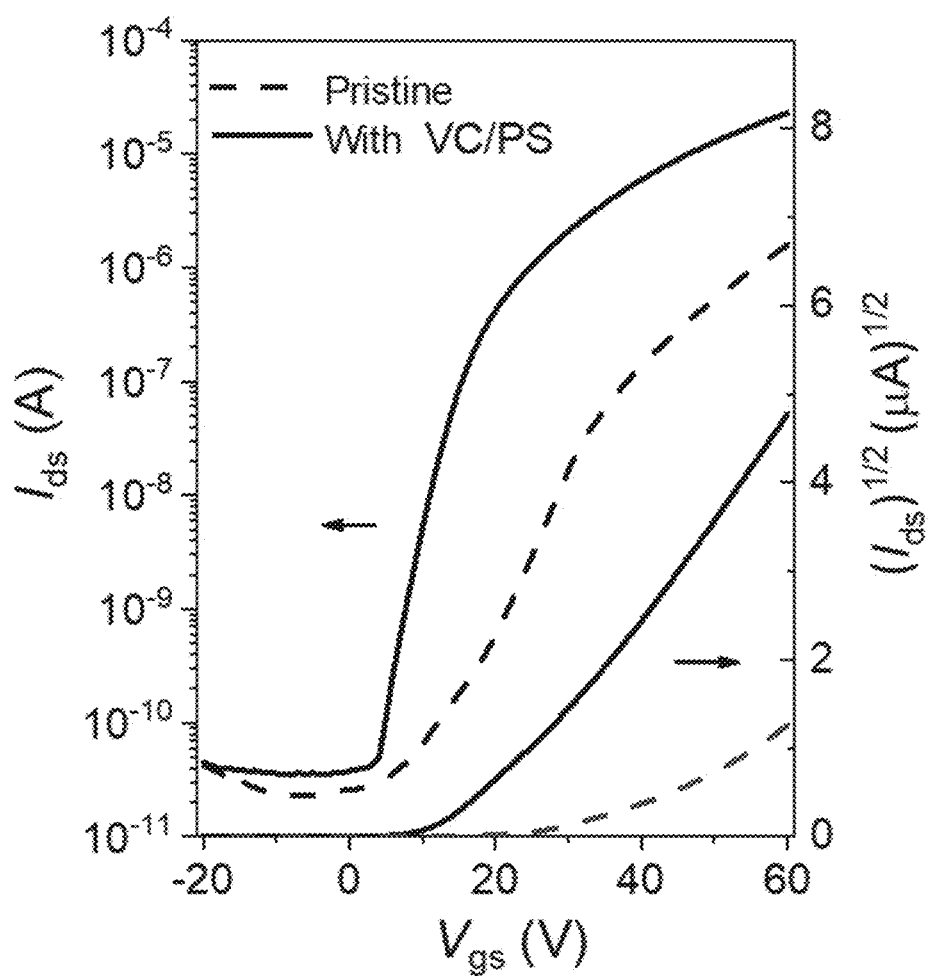
FIG. 7B is the transfer curves of untreated (Comparative embodiment 1) PTCDI-$C_8$ thin film organic field effect transistor and PTCDI-$C_8$ thin film organic field effect transistor treated with blend thin film of ascorbic acid and polystyrene (Embodiment 13) under environmental conditions.
Figure 7C:
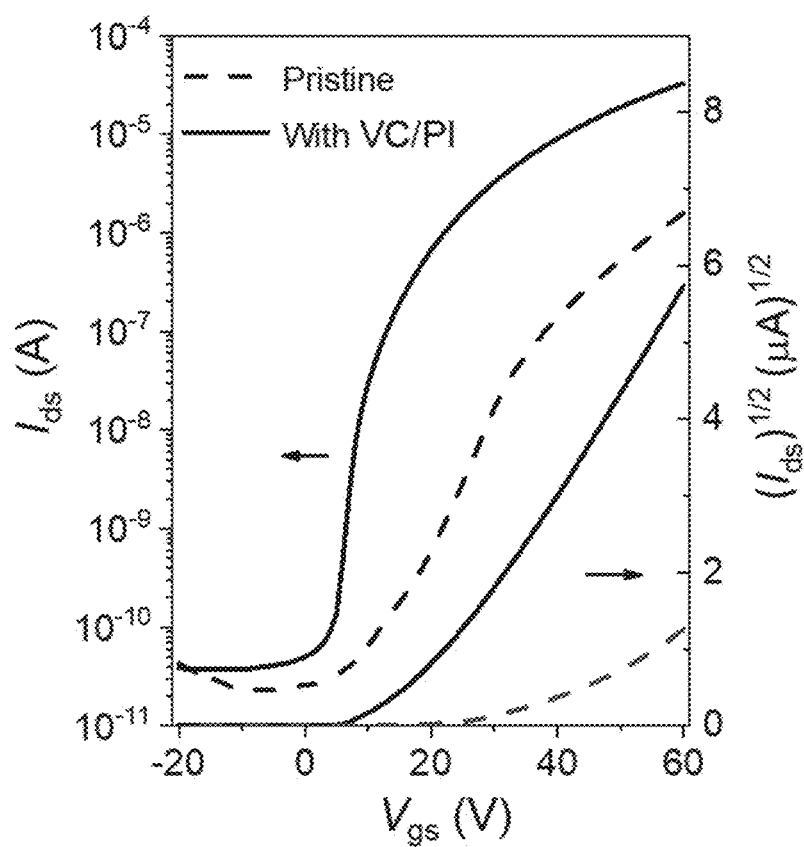
FIG. 7C is the transfer curves of untreated (Comparative embodiment 1) PTCDI-$C_8$ thin film organic field effect transistor and PTCDI-$C_8$ thin film organic field effect transistor treated with blend thin film of ascorbic acid and polyimide (Embodiment 14) under environmental conditions.
Figure 7D:
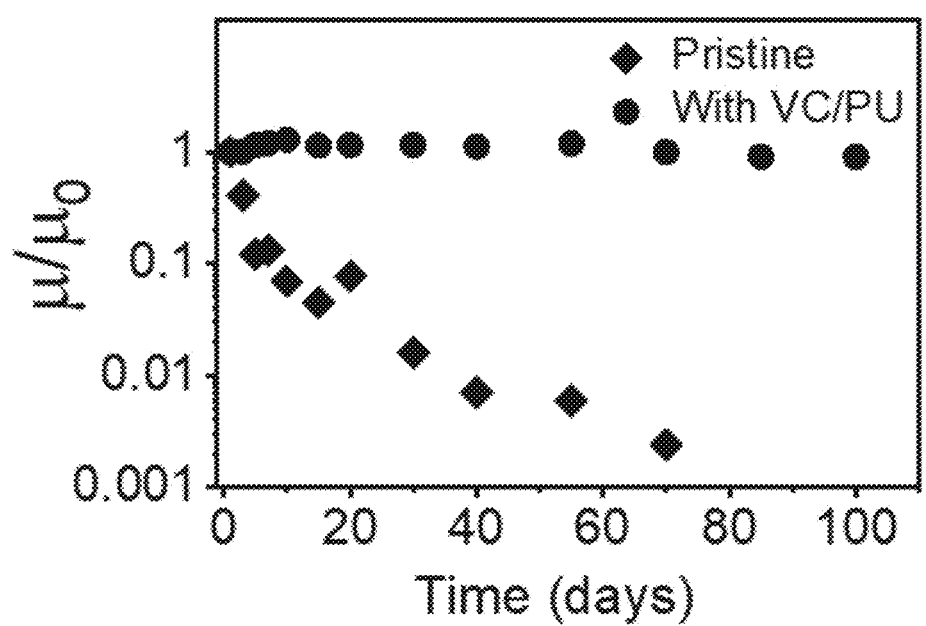
FIG. 7D shows time-varying property parameters of PTCDI-$C_8$ thin film organic field effect transistor treated with blend thin film of ascorbic acid and polyurethane under air condition.
Figure 7E:
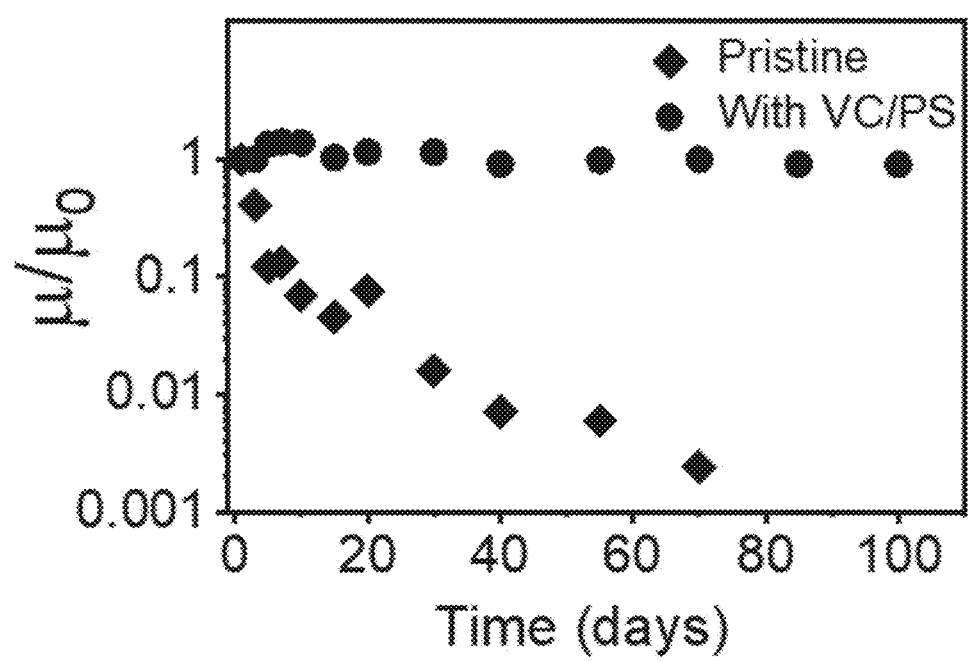
FIG. 7E shows time-varying property parameters of PTCDI-$C_8$ thin film organic field effect transistor treated with blend thin film of ascorbic acid and polystyrene under air condition.
Figure 7F:
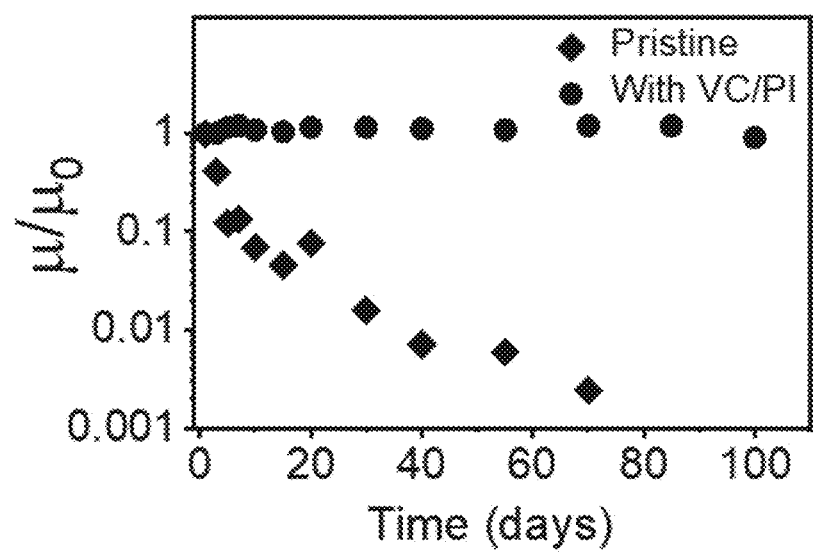
FIG. 7F shows time-varying property parameters of PTCDI-$C_8$ thin film organic field effect transistor treated with blend thin film of ascorbic acid and polyimide under air condition.

The time-varying electrical properties and property parameters of Embodiments 13-15 and Comparative embodiment 1 are tested under environmental conditions. Results are shown in FIG. 7A-FIG. 7E. FIG. 7A is the transfer curves of untreated (Comparative embodiment 1) PTCDI-$C_8$ thin film organic field effect transistor and PTCDI-$C_8$ thin film organic field effect transistor treated with blend thin film of ascorbic acid and polyurethane (Embodiment 12) under environmental conditions. FIG. 7B is the transfer curves of untreated (Comparative embodiment 1) PTCDI-$C_8$ thin film organic field effect transistor and PTCDI-$C_8$ thin film organic field effect transistor treated with blend thin film of ascorbic acid and polystyrene (Embodiment 13) under environmental conditions. FIG. 7C is the transfer curves of untreated (Comparative embodiment 1) PTCDI-$C_8$ thin film organic field effect transistor and PTCDI-$C_8$ thin film organic field effect transistor treated with blend thin film of ascorbic acid and polyimide (Embodiment 14) under environmental conditions. FIG. 7D shows time-varying property parameters of PTCDI-$C_8$ thin film organic field effect transistor treated with blend thin film of ascorbic acid and polyurethane under air condition. FIG. 7E shows time-varying property parameters of PTCDI-$C_8$ thin film organic field effect transistor treated with blend thin film of ascorbic acid and polystyrene under air condition. FIG. 7F shows time-varying property parameters of PTCDI-$C_8$ thin film organic field effect transistor treated with blend thin film of ascorbic acid and polyimide under air condition. As can be seen from FIG. 7A-FIG. 7E. 7, the initial electrical properties of the organic field effect transistor treated with ascorbic acid and polymer are obviously stronger than those of the corresponding pristine device without antioxidant and polymer treatment, and remain stable for a long time.

Figure 8A:
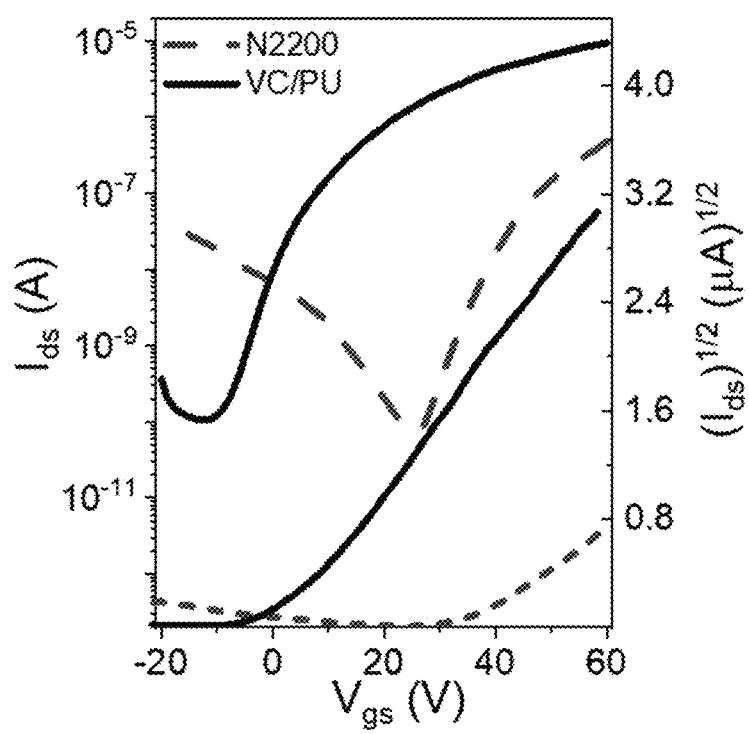
FIG. 8A shows transfer curves of untreated N2200 thin film field effect transistor and N2200 film field effect transistor treated with blend thin film of antioxidant and polyurethane.
Figure 8B:
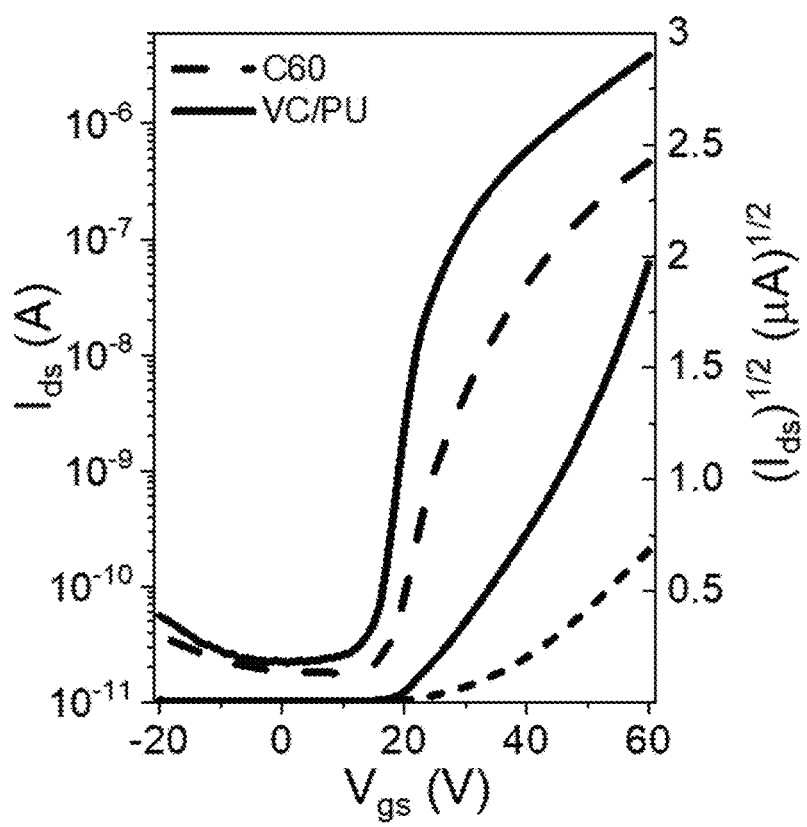
FIG. 8B shows transfer curves of untreated C60 thin film field effect transistor and C60 thin film field effect transistor treated with blend thin film of antioxidant and polyurethane.
Figure 8C:
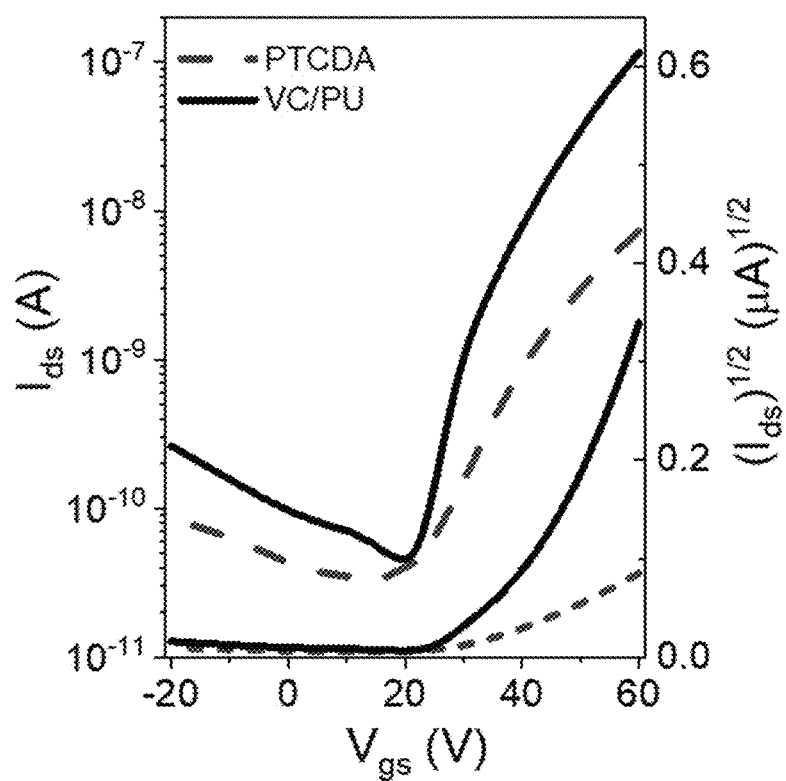
FIG. 8C shows transfer curves of untreated PTCDA thin film field effect transistor and PTCDA thin film field effect transistor treated with blend thin film of antioxidant and polyurethane.
Figure 8D:
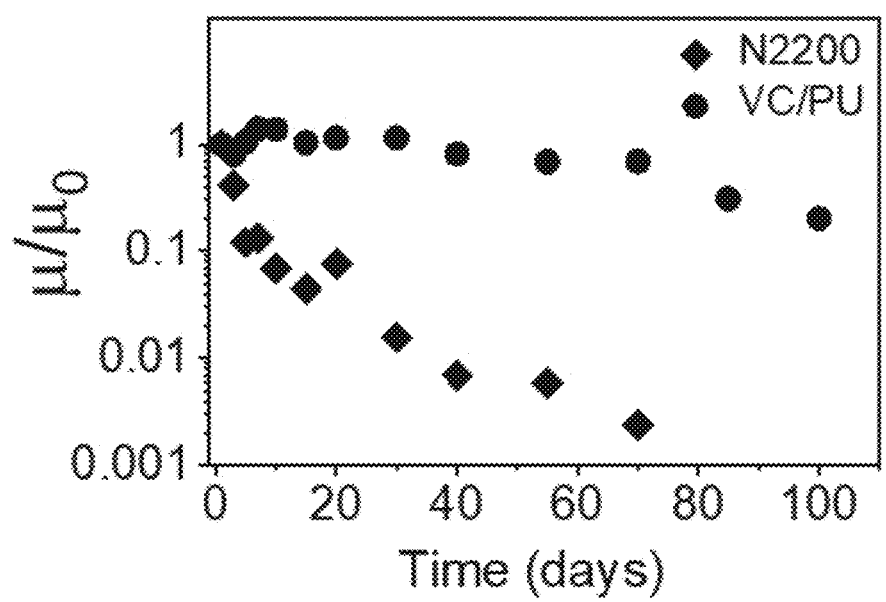
FIG. 8D shows time-varying property parameters ($\mu/\mu_0$, $\mu$ and $V_t$) of untreated N2200 film field effect transistor and N2200 film field effect transistor treated with blend thin film of antioxidant and polyurethane under air condition.
Figure 8E:
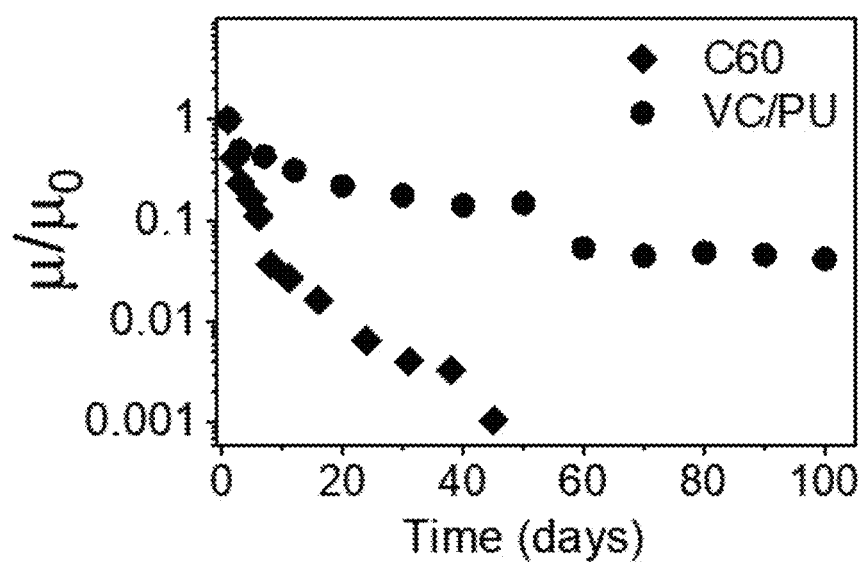
FIG. 8E shows time-varying property parameters ($\mu/\mu_0$, $\mu$ and $V_t$) of untreated C60 thin film field effect transistor and C60 thin film field effect transistor treated with blend thin film of antioxidant and polyurethane under air condition.
Figure 8F:
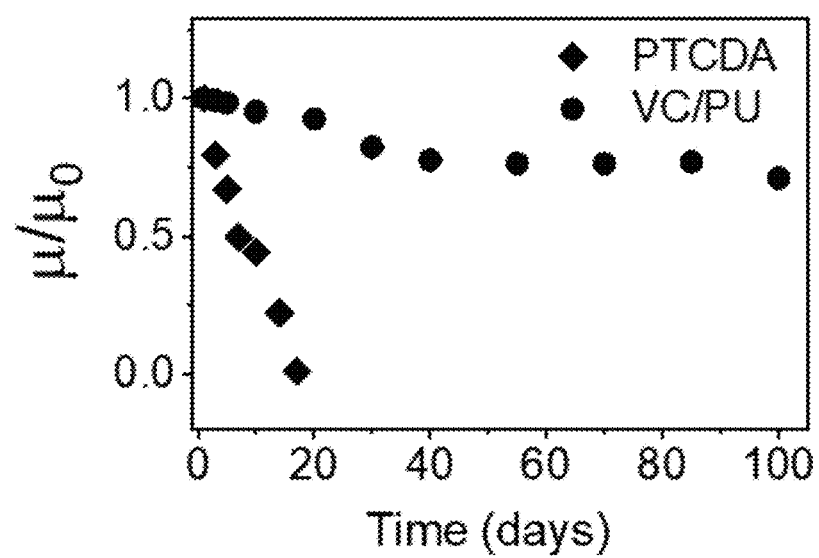
FIG. 8F shows time-varying property parameters ($\mu/\mu_0$, $\mu$ and $V_t$) of untreated PTCDA thin film field effect transistor and PTCDA thin film field effect transistor treated with blend thin film of antioxidant and polyurethane under air condition.
Figure 8G:
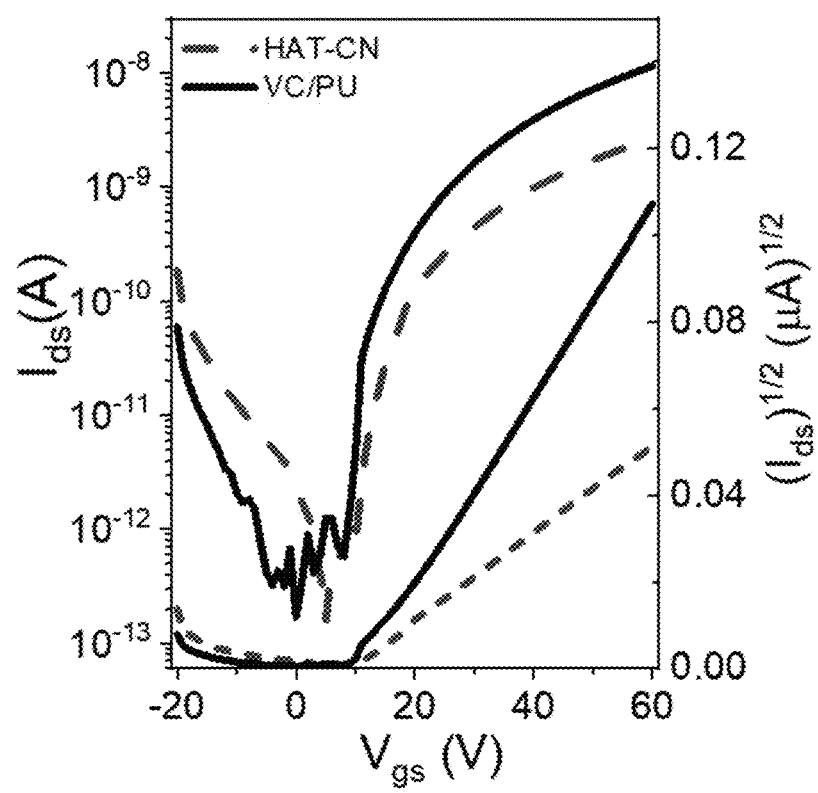
FIG. 8G shows transfer curves of untreated HAT-CN thin film field effect transistor and HAT-CN thin film field effect transistor treated with blend thin film of antioxidant and polyurethane.
Figure 8H:
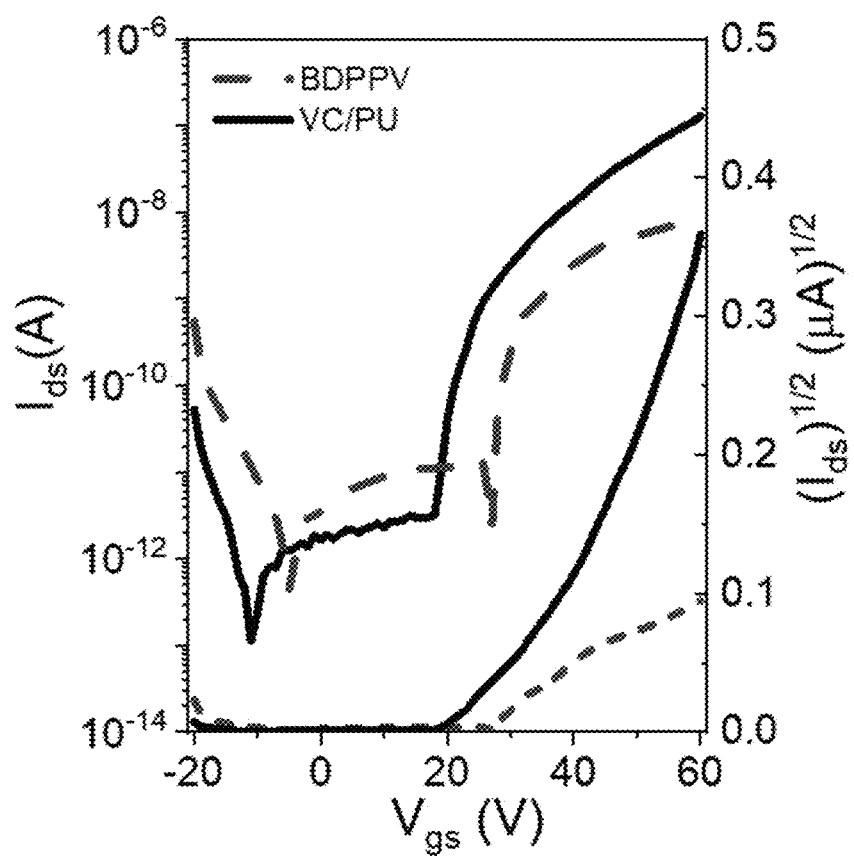
FIG. 8H shows transfer curves of untreated benzodifurandione-based polyphenylene vinylene (BDPPV) field effect transistor and BDPPV field effect transistor treated with blend thin film of antioxidant and polyurethane.
Figure 8I:
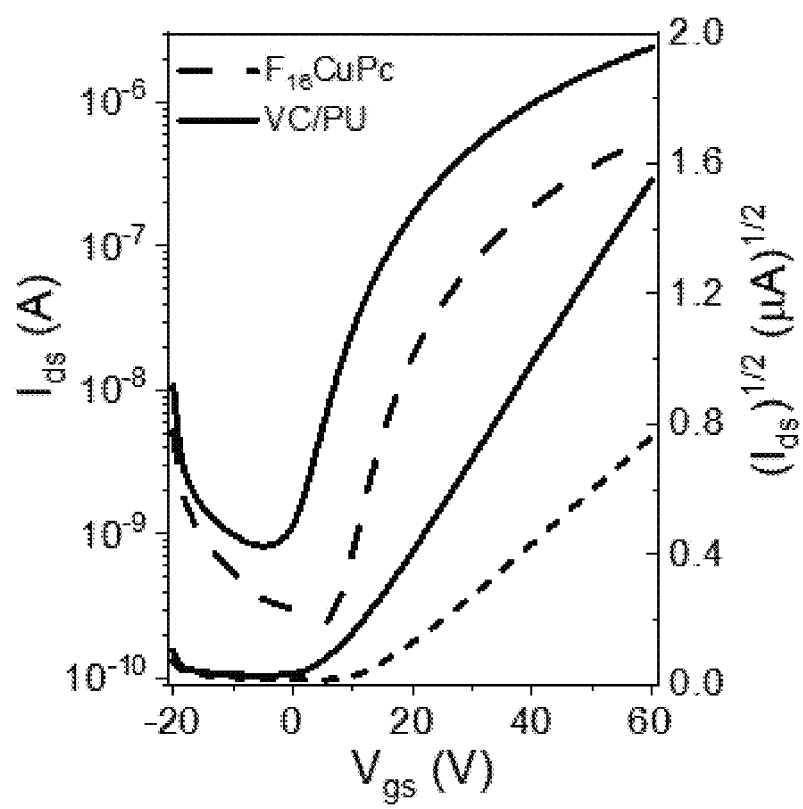
FIG. 8I shows transfer curves of untreated $F_{16}$CuPc thin film field effect transistor and $F_{16}$CuPc thin film field effect transistor treated with blend thin film of antioxidant and polyurethane.
Figure 8J:
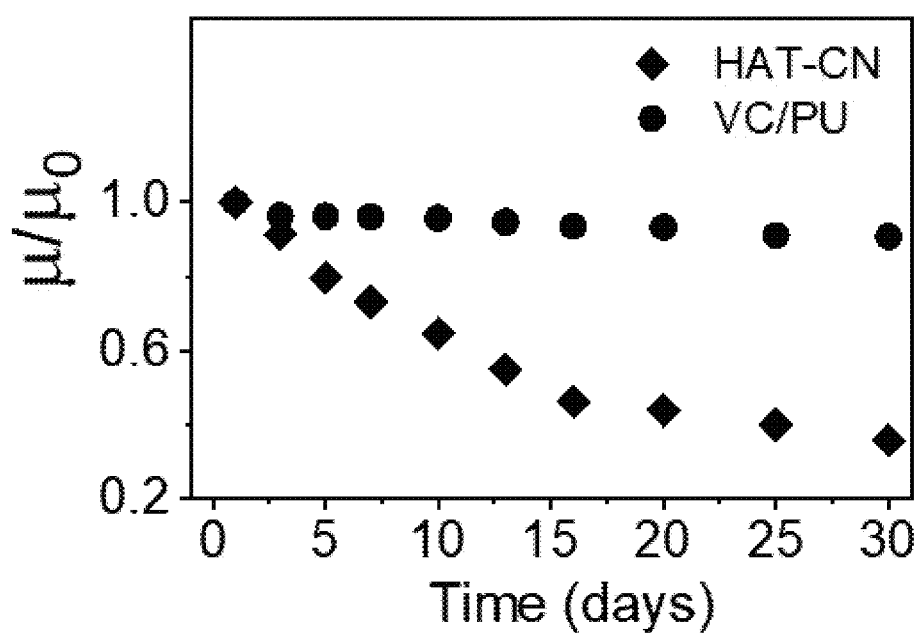
FIG. 8J shows time-varying property parameters ($\mu/\mu_0$, $\mu$ and $V_t$) of untreated HAT-CN thin film field effect transistor and HAT-CN field effect transistor treated with blend thin film of antioxidant and polyurethane under air condition.
Figure 8K:
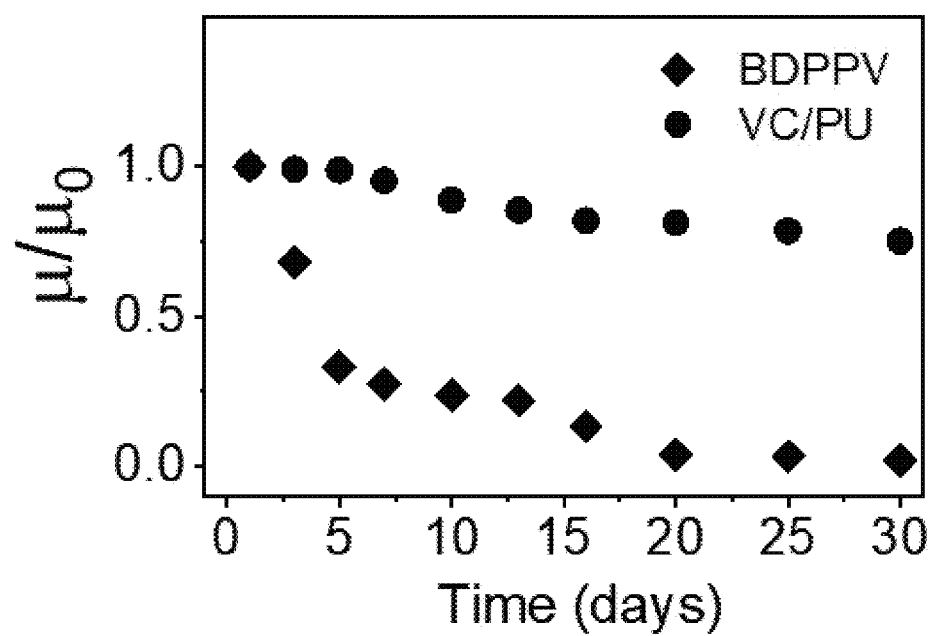
FIG. 8K shows time-varying property parameters ($\mu/\mu_0$, $\mu$ and $V_t$) of untreated BDPPV field effect transistor and BDPPV field effect transistor treated with blend thin film of antioxidant and polyurethane under air condition.
Figure 8L:
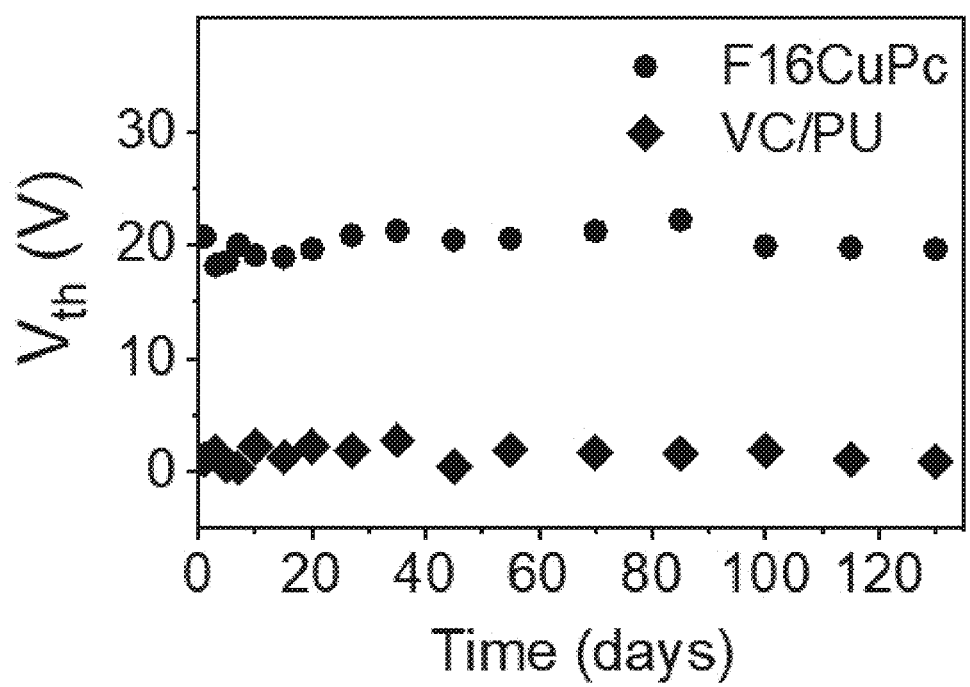
FIG. 8L shows time-varying property parameters ($\mu/\mu_0$, $\mu$ and $V_t$) of untreated $F_{16}CuPc$ thin film field effect transistor and $F_{16}CuPc$ thin film field effect transistor treated with blend thin film of antioxidant and polyurethane under air condition.
Figure 8M:
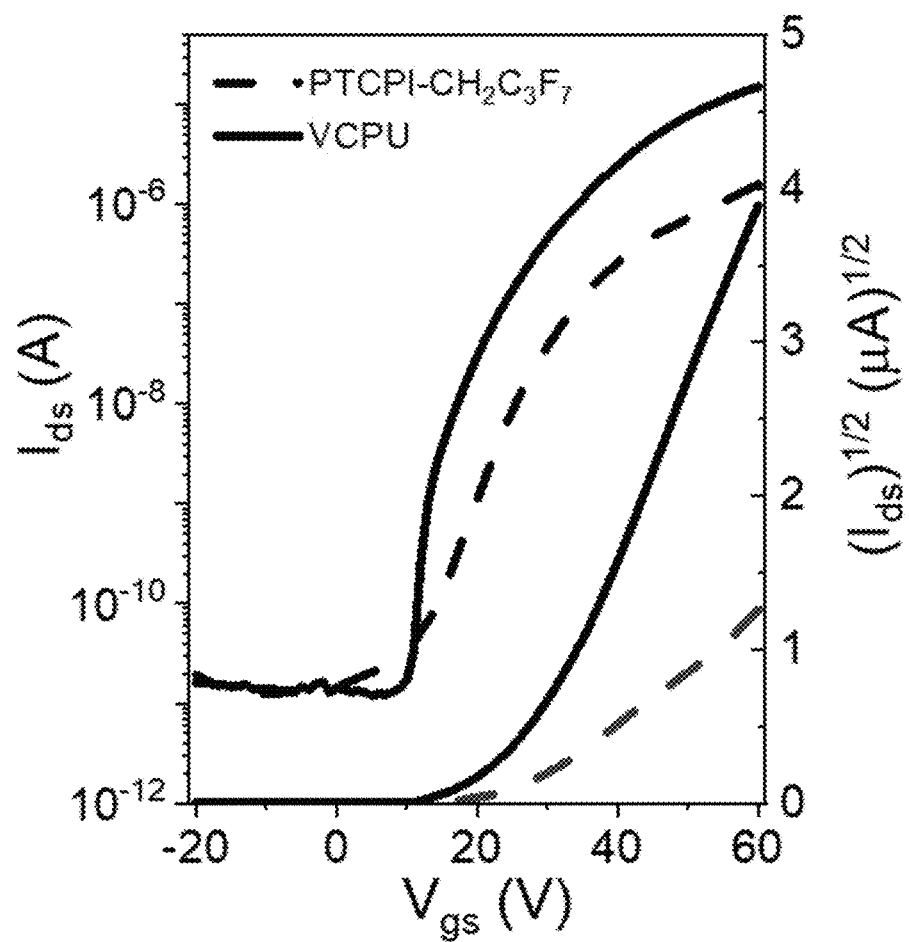
FIG. 8M shows transfer curves of untreated PTCP-$CH_2C_3F_7$ thin film field effect transistor and PTCP-$CH_2C_3F_7$ thin film field effect transistor treated with blend thin film of antioxidant and polyurethane.
Figure 8N:
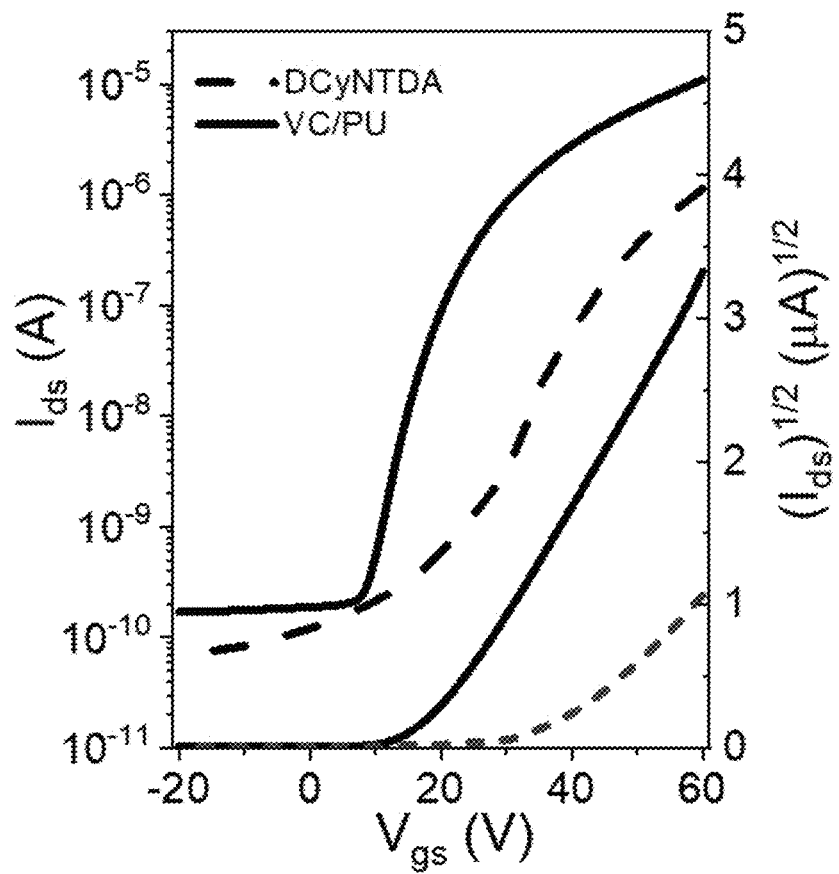
FIG. 8N shows transfer curves of untreated DCyNTDA thin film field effect transistor and DCyNTDA thin film field effect transistor treated with blend thin film of antioxidant and polyurethane.
Figure 8O:
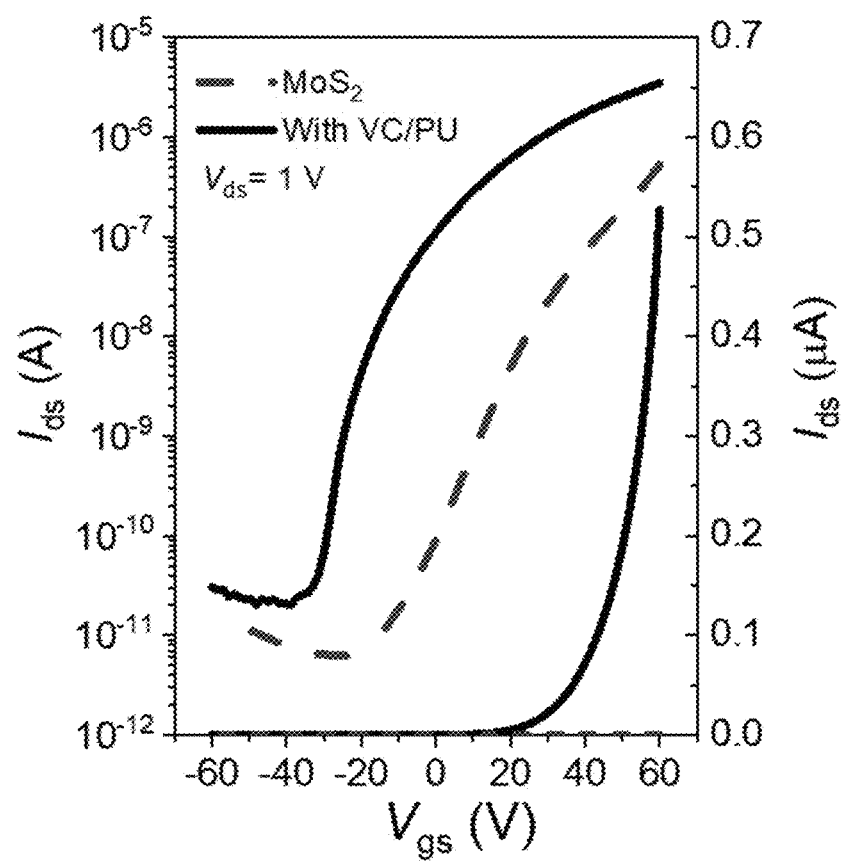
FIG. 8O shows transfer curves of untreated $MoS_2$ film field effect transistor and $MoS_2$ film field effect transistor treated with blend thin film of antioxidant and polyurethane.
Figure 8P:
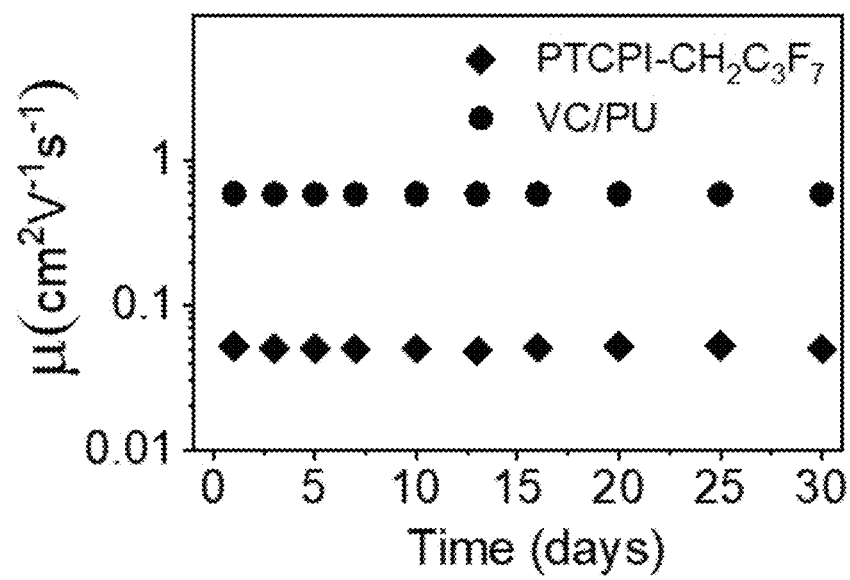
FIG. 8P shows time-varying property parameters ($\mu/\mu_0$, $\mu$ and $V_1$) of untreated PTCP-$CH_2C_3F_7$ thin film field effect transistor and PTCP-$CH_2C_3F_7$ thin film field effect transistor treated with blend thin film of antioxidant and polyurethane under air condition.
Figure 8Q:
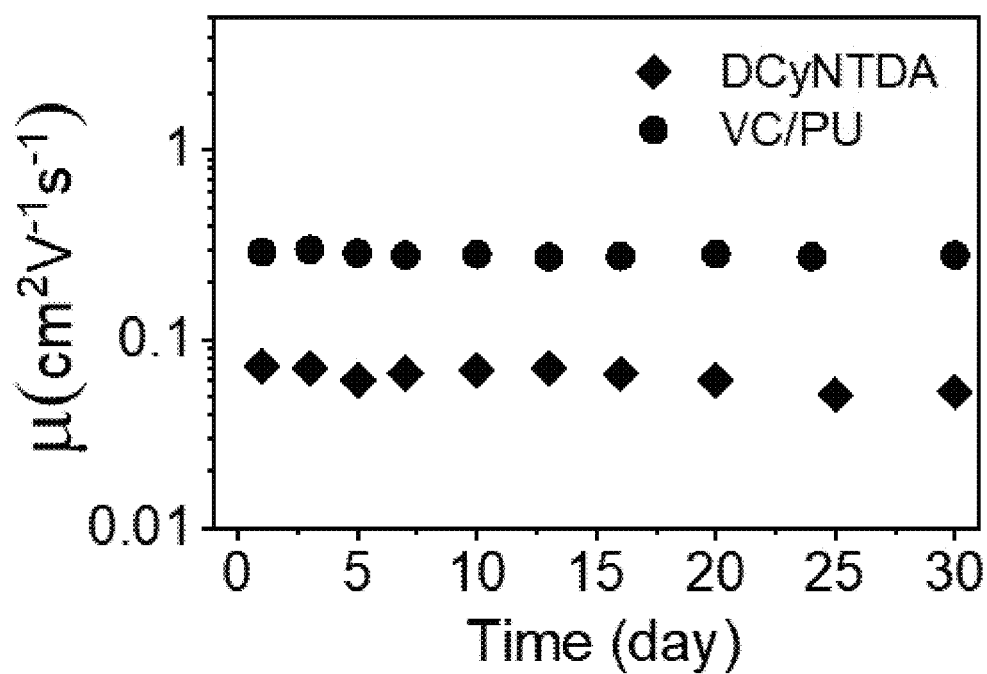
FIG. 8Q shows time-varying property parameters ($\mu/\mu_0$, $\mu$ and $V_1$) of untreated DCyNTDA thin film field effect transistor and DCyNTDA thin film field effect transistor treated with blend thin film of antioxidant and polyurethane under air condition.
Figure 8R:
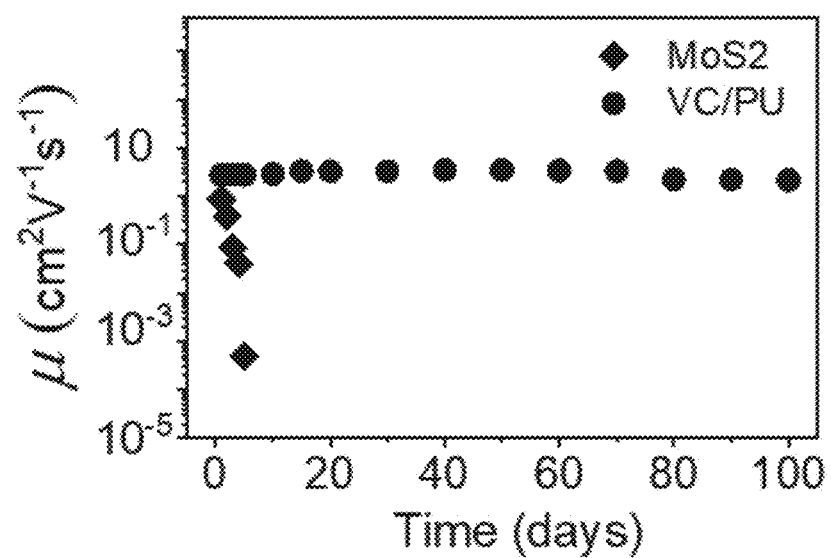
FIG. 8R shows time-varying property parameters ($\mu/\mu_0$, $\mu$ and $V_1$) of untreated $MoS_2$ film field effect transistor and $MoS_2$ film field effect transistor treated with blend thin film of antioxidant and polyurethane under air condition.

8. The Molecular Universality of Ascorbic Acid in Scavenging Oxygen in Semiconductors The time-varying electrical properties and property parameters of Embodiments 15-23 and Comparative embodiments 2-10 are tested under environmental conditions, and the results are shown in FIG. 8A-FIG. 8R. FIG. 8A shows transfer curves of untreated (Comparative embodiment 2) N2200 thin film field effect transistor (field effect transistor) and N2200 film field effect transistor treated with blend thin film of ascorbic acid and polyurethane (Embodiment 15). FIG. 8B shows transfer curves of untreated (Comparative embodiment 3) C60 thin film field effect transistor and C60 thin film field effect transistor treated with blend thin film of ascorbic acid and polyurethane (Embodiment 16). FIG. 8C shows transfer curves of untreated (Comparative embodiment 3) PTCDA thin film field effect transistor and PTCDA thin film field effect transistor treated with blend thin film of ascorbic acid and polyurethane (Embodiment 17). FIG. 8G shows transfer curves of untreated (Comparative embodiment 5) HAT-CN thin film field effect transistor and HAT-CN field effect transistor treated with blend thin film of ascorbic acid and polyurethane (Embodiment 18). FIG. 8H shows transfer curves of untreated (Comparative embodiment 6) BDPPV field effect transistor and BDPPV field effect transistor treated with blend thin film of ascorbic acid and polyurethane (Embodiment 19). FIG. 8I shows transfer curves of untreated (Comparative embodiment 7) $F_{16}CuPc$ thin film field effect transistor and $F_{16}CuPc$ thin film field effect transistor treated with blend thin film of ascorbic acid and polyurethane (Embodiment 20). FIG. 8M shows transfer curves of untreated (Comparative embodiment 8) PTCP-$CH_2C_3F_7$ thin film field effect transistor and PTCP-$CH_2C_3F_7$ thin film field effect transistor treated with blend thin film of ascorbic acid and polyurethane (Embodiment 21). FIG. 8N shows transfer curves of untreated (Comparative embodiment 9) DCyNTDA thin film field effect transistor and DCyNTDA thin film field effect transistor treated with blend thin film of ascorbic acid and polyurethane (Embodiment 22). FIG. 8O shows transfer curves of untreated (Comparative embodiment 10) $MoS_2$ film field effect transistor and $MoS_2$ film field effect transistor treated with blend thin film of ascorbic acid and polyurethane (Embodiment 23). FIG. 8D shows time-varying property parameters ($\mu/\mu_0$, $\mu$ and $V_t$) of untreated N2200 film field effect transistor and N2200 film field effect transistor treated with blend thin film of ascorbic acid and polyurethane under air condition. FIG. 8E shows time-varying property parameters ($\mu/\mu_0$, $\mu$ and $V_t$) of untreated C60 thin film field effect transistor and C60 thin film field effect transistor treated with blend thin film of ascorbic acid and polyurethane under air condition. FIG. 8F shows time-varying property parameters ($\mu/\mu_0$, $\mu$ and $V_t$) of untreated PTCDA thin film field effect transistor and PTCDA thin film field effect transistor treated with blend thin film of ascorbic acid and polyurethane under air condition. FIG. 8J shows time-varying property parameters ($\mu/\mu_0$, $\mu$ and $V_t$) of untreated HAT-CN thin film field effect transistor and HAT-CN thin film field effect transistor treated with blend thin film of ascorbic acid and polyurethane under air condition. FIG. 8K shows time-varying property parameters ($\mu/\mu_0$, $\mu$ and $V_t$) of untreated BDPPV field effect transistor and BDPPV field effect transistor treated with blend thin film of ascorbic acid and polyurethane under air condition. FIG. 8L shows time-varying property parameters ($\mu/\mu_0$, $\mu$ and $V_t$) of untreated $F_{16}CuPc$ thin film field effect transistor and $F_{16}CuPc$ thin film field effect transistor treated with blend thin film of ascorbic acid and polyurethane under air condition. FIG. 8P shows time-varying property parameters ($\mu/\mu_0$, $\mu$ and $V_t$) of untreated $PTCP-CH_2C_3F_7$ thin film field effect transistor and $PTCP-CH_2C_3F_7$ thin film field effect transistor treated with blend thin film of ascorbic acid and polyurethane under air condition. FIG. 8Q shows time-varying property parameters ($\mu/\mu_0$, $\mu$ and $V_t$) of untreated DCyNTDA thin film field effect transistor and DCyNTDA thin film field effect transistor treated with blend thin film of ascorbic acid and polyurethane under air condition. FIG. 8R shows time-varying property parameters ($\mu/\mu_0$, $\mu$ and $V_t$) of untreated $MoS_2$ film field effect transistor and $MoS_2$ film field effect transistor treated with blend thin film of ascorbic acid and polyurethane under air condition. It can be seen from FIG. 8A-FIG. 8R, initial electrical properties of N2200 film field effect transistor, C60 thin film field effect transistor, PTCDA thin film field effect transistor, HAT-CN thin film field effect transistor, $F_{16}CuPc$ thin film field effect transistor, $PTCP-CH_2C_3F_7$ thin film field effect transistor, DCyNTDA thin film field effect transistor and $MoS_2$ film field effect transistor treated with blend thin film of ascorbic acid and polyurethane are obviously stronger than those of the corresponding pristine device without antioxidant treatment, and remain stable for a long time.

9. Effect of Ascorbic Acid on Photooxidation of Semiconductor

Figure 9A:
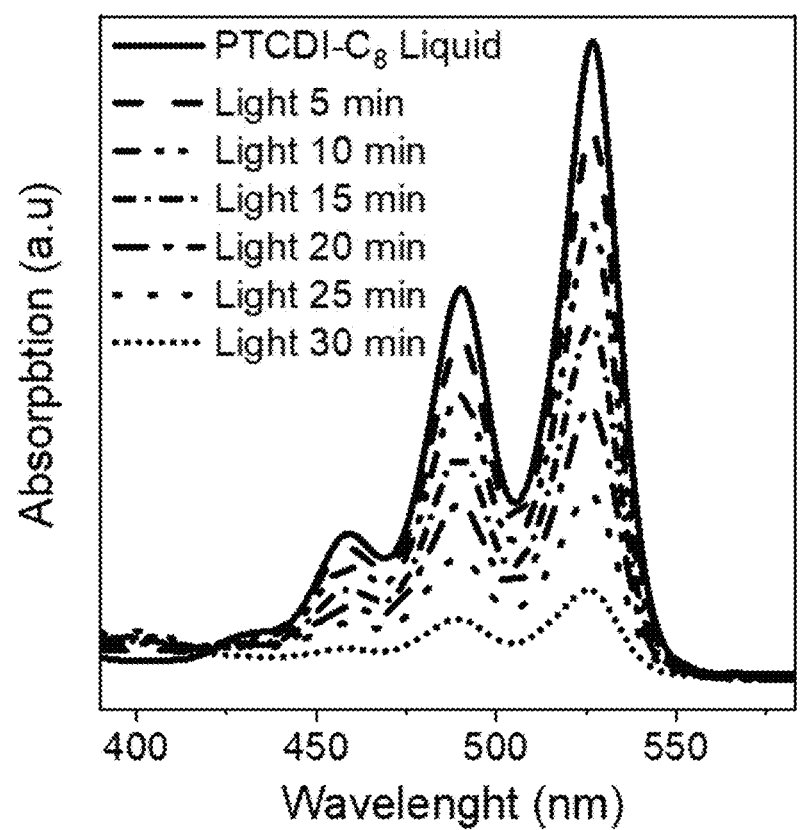
FIG. 9A is ultraviolet absorption spectra of pure PTCDI-$C_8$ solution without antioxidant powder.
Figure 9B:
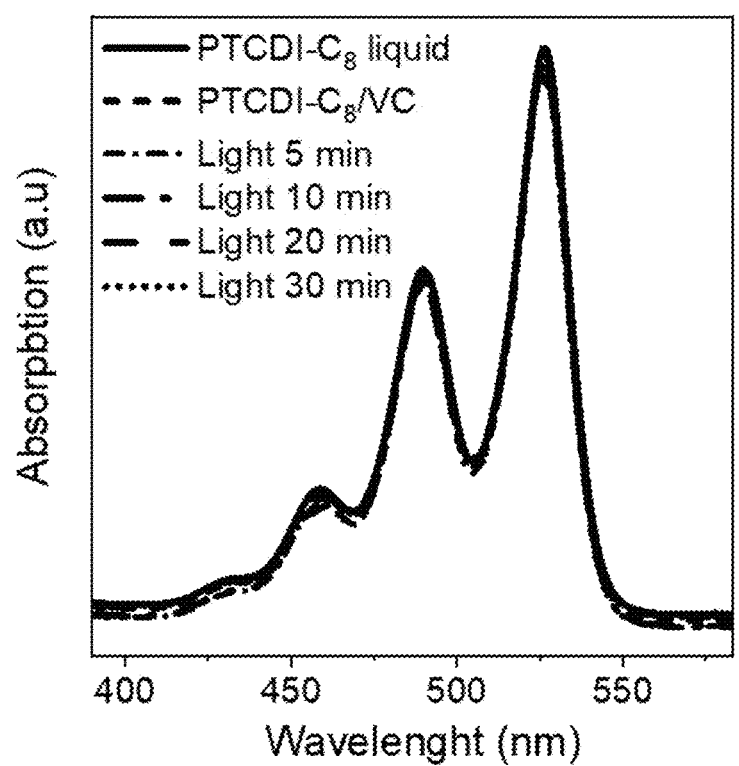
FIG. 9B is ultraviolet absorption spectra of PTCDI-$C_8$ solution with antioxidant powder.
Figure 9C:
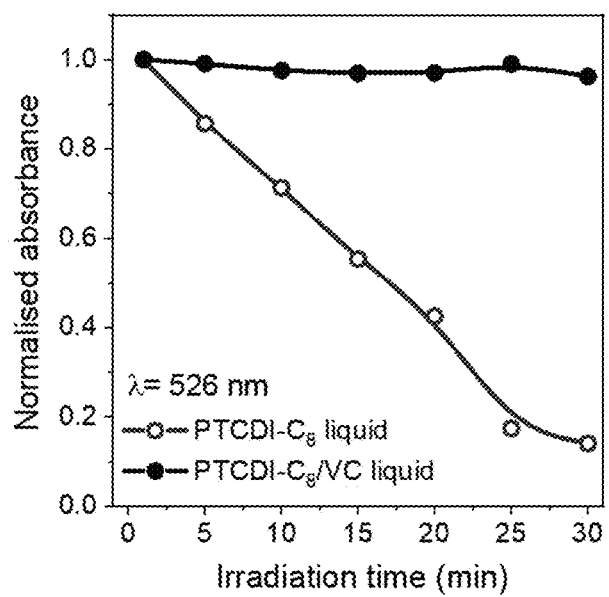
FIG. 9C is the relationship between normalized absorption intensity and irradiation time under wavelength of 518 nm of pure PTCDI-$C_8$ solution without antioxidant powder and PTCDI-$C_8$ solution with antioxidant powder.

The ultraviolet absorption spectrum of $PTCDI-C_8$ solution with or without ascorbic acid powder is tested under continuous illumination. The ultraviolet absorption spectrum is shown in FIG. 9A-FIG. 9C. FIG. 9A is pure, where with the illumination to $PTCDI-C_8$, the oxidation of $PTCDI-C_8$ is accelerated by illumination because of the generation of oxygen and the existence of other species, and its absorption peak intensity is gradually weakened. FIG. 9B is $PTCDI-C_8$ solution with ascorbic acid powder, and the absorption peak intensity of $PTCDI-C_8$ remains unchanged with illumination, which proves that ascorbic acid eliminates oxygen and other species, and inhibits its photooxidation process. In addition, FIG. 9C compares the relationship between normalized absorption intensity and irradiation time when the wavelength of $PTCDI-C_8$ solution without and with ascorbic acid powder is 518 nm, which proves once again that the addition of ascorbic acid powder may inhibit the photooxidation (photobleaching) process of $PTCDI-C_8$.

What is claimed is:

1. A method for enhancing stability of an N-type semiconductor through oxygen elimination, comprising constructing an antioxidant layer on a surface of the N-type semiconductor by using an antioxidant solution, wherein the antioxidant is one of a metal ion chelating agent, a peroxide decomposer, and an enzyme antioxidant by uniformly coating the solution on a surface of the N-type semiconductor material by dip-coating or drop-casting.

2. The method for enhancing stability of the N-type semiconductor through oxygen elimination according to claim 1, wherein a concentration of the antioxidant in the solution is controlled in a range of $1\times10^{-5}$ mol/mL-100 mol/mL.

3. The method for enhancing stability of the N-type semiconductor through oxygen elimination according to claim 1, wherein a thickness of an obtained antioxidant layer is controlled between 1 nm and 2 cm.

4. The method for enhancing stability of the N-type semiconductor through oxygen elimination according to claim 1, wherein the metal ion chelating agent is ethylene diamine tetraacetic acid, aminotriacetic acid, dihydroxyethyl glycine, ethylenediaminetetraacetic acid disodium salt, citric acid, tartaric acid, gluconic acid, sodium gluconate, ammonium citrate, hydroxyethyl ethylenediamine triacetic acid, polyacrylic acid, polymethacrylic acid, hydrolyzed polymaleic anhydride.

5. The method for enhancing stability of the N-type semiconductor through oxygen elimination according to claim 1, wherein the peroxide decomposer is subphosphite ester, dithiophosphoric acid-O,O-dimethyl ester, and dithiophosphoric acid-O,O-dimethyl ester.

6. The method for enhancing stability of the N-type semiconductor through oxygen elimination according to claim 1, wherein the enzyme antioxidant is superoxide dismutase, thioredoxin peroxidase, glutathione peroxidase, catalase.

7. The method for enhancing stability of the N-type semiconductor through oxygen elimination according to claim 1, wherein the N-type semiconductor material is C60, PTCDA, $PTCP-CH_2C_3F_7$, DCyNTDA, $F_{16}CuPc$ or HAT-CN, N2200, BDPPV, black phosphorus (BP), $WS_2$, $MoS_2$.

* * * * *